(12) United States Patent  
Kwon et al.

(10) Patent No.: US 9,514,673 B2
(45) Date of Patent: Dec. 6, 2016

(54) ORGANIC LIGHT EMITTING DISPLAY DEVICE

(71) Applicant: LG DISPLAY CO., LTD., Seoul (KR)

(72) Inventors: Jae Wook Kwon, Paju-si (KR); Bum Sik Kim, Suwon-si (KR); Kil Hwan Oh, Seoul (KR); Hye Mi Oh, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 21 days.

(21) Appl. No.: 14/065,131

(22) Filed: Oct. 28, 2013

(65) Prior Publication Data

US 2014/0139413 A1 May 22, 2014

(30) Foreign Application Priority Data

Nov. 22, 2012 (KR) .................. 10-2012-0133001
Dec. 4, 2012 (KR) .................. 10-2012-0139817

(51) Int. Cl.
G09G 3/30 (2006.01)
G09G 3/32 (2016.01)
H01L 27/32 (2006.01)

(52) U.S. Cl.
CPC .......... *G09G 3/3208* (2013.01); *H01L 27/3276* (2013.01); *G09G 2300/0408* (2013.01); *G09G 2300/0426* (2013.01); *G09G 2310/0272* (2013.01); *G09G 2320/0223* (2013.01); *G09G 2330/021* (2013.01); *G09G 2330/04* (2013.01); *H01L 27/3223* (2013.01)

(58) Field of Classification Search
CPC .......... G09G 3/30; G09G 3/32; G09G 3/3208; G09G 3/3225; G09G 3/3266; G09G 3/3275; G09G 2300/0404; G09G 2300/0408; G09G 2310/0264; G09G 2310/0272; G09G 2310/0278
USPC .................... 345/76, 80, 204, 214
See application file for complete search history.

(56) References Cited

U.S. PATENT DOCUMENTS

| | | | |
|---|---|---|---|
| 6,380,688 B1* | 4/2002 | Bae | G09G 3/3233 315/169.3 |
| 6,882,396 B2* | 4/2005 | Ko | G02F 1/13452 349/149 |
| 8,242,698 B2* | 8/2012 | Tokuda | H01L 27/3276 315/160 |

(Continued)

FOREIGN PATENT DOCUMENTS

CN 1734542 A 2/2006
CN 101488518 A 7/2009

*Primary Examiner* — Jason Mandeville
(74) *Attorney, Agent, or Firm* — Birch, Stewart, Kolasch & Birch, LLP

(57) ABSTRACT

Discussed is an organic light emitting display device. The organic light emitting display device includes a first substrate configured to include an active area including a plurality of pixels and upper, lower, left, and right inactive areas defined near the active area, and a second substrate facing-coupled to the first substrate. The first substrate includes a plurality of data lines and a plurality of gate lines formed in the active area, a plurality of driving power lines formed in parallel with the plurality of data lines to supply a driving voltage to the pixels, a cathode electrode layer connected to the pixels in common to supply a cathode voltage to the pixels, a plurality of driving power pads provided in each of the upper and lower inactive areas, and a plurality of cathode connection parts provided in each of the left and right inactive areas.

6 Claims, 17 Drawing Sheets

(56) References Cited

U.S. PATENT DOCUMENTS

| | | | | |
|---|---|---|---|---|
| 8,386,801 B2* | 2/2013 | Devadas | | G06F 21/31 257/E23.179 |
| 8,836,675 B2* | 9/2014 | Takenaka | | G02F 1/13452 345/204 |
| 2004/0004444 A1* | 1/2004 | Choi | | G09G 3/3208 315/169.2 |
| 2004/0061694 A1* | 4/2004 | Noguchi | | G09G 3/3233 345/204 |
| 2006/0017665 A1* | 1/2006 | Ko et al. | | 345/76 |
| 2006/0022969 A1* | 2/2006 | Lee | | G02F 1/136286 345/211 |
| 2006/0170342 A1* | 8/2006 | Kim | | H01L 27/3276 313/512 |
| 2007/0134830 A1 | 6/2007 | Park et al. | | |
| 2007/0216299 A1 | 9/2007 | Park et al. | | |
| 2008/0036707 A1* | 2/2008 | Sung | | G09G 3/3225 345/76 |
| 2008/0048948 A1* | 2/2008 | Koh | | G09G 3/3208 345/80 |
| 2009/0184627 A1* | 7/2009 | Kim et al. | | 313/504 |
| 2009/0184899 A1 | 7/2009 | Kim et al. | | |
| 2011/0102402 A1* | 5/2011 | Han | | 345/211 |
| 2011/0310543 A1* | 12/2011 | Kim | | G02F 1/133308 361/679.01 |

\* cited by examiner

ORGANIC LIGHT EMITTING DISPLAY DEVICE

CROSS-REFERENCE TO RELATED APPLICATIONS

This application claims the benefit of the Korean Patent Application Nos. 10-2012-0133001 filed on Nov. 22, 2012, and 10-2012-0139817 filed on Dec. 4, 2012, which are hereby incorporated by reference as if fully set forth herein.

BACKGROUND

1. Field of the Invention

The present invention relates to an organic light emitting display device.

2. Discussion of the Related Art

Recently, with the advancement of multimedia, the importance of flat panel display (FPD) devices is increasing. Therefore, various FPD devices such as liquid crystal display (LCD) devices, plasma display panel (PDP) devices, and organic light emitting display devices are being used practically. In such FPD devices, the organic light emitting display devices have a fast response time of 1 ms or less and low power consumption, and have no limitation in a viewing angle because the organic light emitting display devices self-emit light. Accordingly, the organic light emitting display devices are attracting much attention as next generation FPD devices.

General organic light emitting display devices include a display panel, including a plurality of pixels that are respectively formed a plurality of pixel areas defined by intersections between a plurality of data lines and a plurality of gate lines, and a panel driver that emits light from the plurality of pixels.

Each of the pixels of the display panel, as illustrated in FIG. 1, includes a switching transistor ST, a driving transistor DT, and a capacitor Cst, and a light emitting element OLED.

The switching transistor ST is turned on by a gate signal GS supplied from a gate line G, and supplies a data voltage Vdata, supplied from a data line D, to the driving transistor DT.

The driving transistor DT is turned on with the data voltage Vdata supplied from the switching transistor ST, and controls a data current Ioled which flows to the light emitting element OLED according to a driving voltage VDD supplied through a driving power line PL.

The capacitor Cst is connected between a gate and source of the driving transistor DT, stores a voltage corresponding to the data voltage Vdata supplied to the gate of the driving transistor DT, and turns on the driving transistor DT with the stored voltage.

The light emitting element OLED includes an anode electrode layer connected to the source of the driving transistor DT, a cathode electrode layer CE receiving a ground voltage, and an organic layer that includes a light emitting layer formed between the anode electrode layer and the cathode electrode layer. The light emitting element OLED emits light in proportion to the data current Ioled supplied from the driving transistor DT.

Each pixel of the general organic light emitting display device controls a level of the data current Ioled, which flows from the driving voltage VDD terminal to the light emitting element OLED, with a switching time of the driving TFT DT based on the data voltage Vdata to emit light from the light emitting element OLED, thereby displaying a certain image.

In the organic light emitting display device, an emission luminance of each pixel is affected by the data voltage Vdata and the driving voltage VDD. Therefore, the driving voltage VDD supplied to each pixel should be constant for a uniform luminance of each pixel.

However, the driving voltage VDD is a direct current (DC) voltage having a predetermined voltage level, and while the driving voltage VDD is supplied to each pixel through the driving power line PL, the driving voltage VDD is dropped by a line resistance of the driving power line PL. As organic light emitting display devices are enlarged in size, the drop of the driving voltage VDD more increases.

Therefore, a method for minimizing a drop of the driving voltage supplied to each pixel is needed.

SUMMARY

Accordingly, the present invention is directed to provide an organic light emitting display device that substantially obviates one or more problems due to limitations and disadvantages of the related art.

An aspect of the present invention is directed to provide an organic light emitting display device for minimizing a drop of a driving voltage supplied to each pixel.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided an organic light emitting display device including: a first substrate configured to include an active area including a plurality of pixels and upper, lower, left, and right inactive areas defined near the active area; and a second substrate facing-coupled to the first substrate, wherein the first substrate includes: a plurality of data lines and a plurality of gate lines formed in the active area to intersect each other, and configured to define a plurality of pixel areas in which the plurality of pixels are respectively formed; a plurality of driving power lines formed in parallel with the plurality of data lines, and configured to supply a driving voltage to the plurality of pixels; a cathode electrode layer connected to the plurality of pixels in common, and configured to supply a cathode voltage to the plurality of pixels; a plurality of driving power pads provided in each of the upper and lower inactive areas to be connected to an upper side and lower side of each of the plurality of driving power lines; and a plurality of cathode connection parts provided in each of the left and right inactive areas to be connected to the cathode electrode layer.

In another aspect of the present invention, there is provided an organic light emitting display device including: a display panel configured to include a plurality of data lines and a plurality of gate lines intersecting each other, and a plurality of pixels respectively formed in a plurality of pixel areas defined by a plurality of driving power lines parallel to the plurality of data lines; a plurality of data drivers configured to convert display data into data voltages according to a data control signal, and respectively supply the data voltages to the plurality of data lines; a plurality of gate drivers configured to generate a gate pulse according to a gate control signal, and supply the gate pulse to the plurality of gate lines; a plurality of upper driving power supply members configured to supply a driving voltage to an upper side of each of the plurality of driving power lines; a plurality of lower driving power supply members configured to supply the driving voltage to a lower side of each of the plurality of driving power lines; a data PCB connected to the plurality of data drivers; and a control board configured to include: a timing controller configured to generate the data control signal and the gate control signal, and supply the display data to the plurality of data drivers; and a power supply configured to generate the driving voltage, and supply the driving voltage to the plurality of upper and lower driving power supply parts through the data PCB.

In another aspect of the present invention, there is provided an organic light emitting display device including: a display panel configured to include a plurality of data lines and a plurality of gate lines intersecting each other, and a plurality of pixels respectively formed in a plurality of pixel areas defined by a plurality of driving power lines parallel to the plurality of data lines; a plurality of data drivers configured to convert display data into data voltages according to a data control signal, respectively supply the data voltages to the plurality of data lines, and supply a driving voltage to an upper side of each of the plurality of driving power lines; a plurality of gate drivers configured to generate a gate pulse according to a gate control signal, and supply the gate pulse to the plurality of gate lines; a plurality of lower driving power supply members configured to supply the driving voltage to a lower side of each of the plurality of driving power lines; a data PCB connected to the plurality of data drivers; and a control board configured to include: a timing controller configured to generate the data control signal and the gate control signal, and supply the display data to the plurality of data drivers; and a power supply configured to generate the driving voltage, and supply the driving voltage to the plurality of lower driving power supply members and simultaneously supply the driving voltage to the plurality of data drivers through the data PCB.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION OF THE INVENTION

Figure 1:
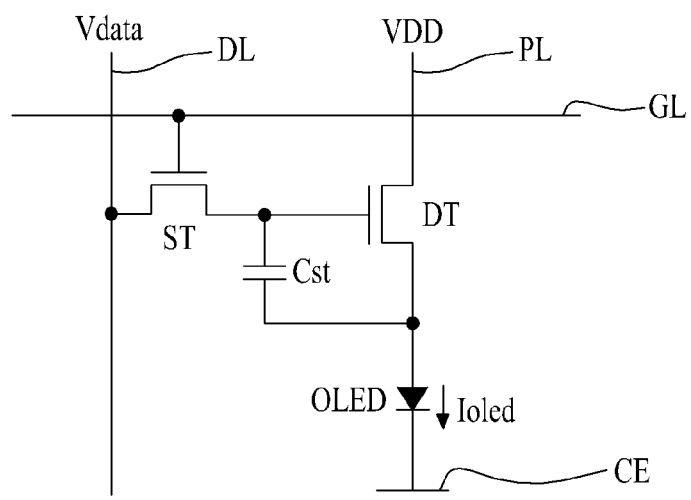
FIG. 1 is a diagram for describing a pixel structure of a general organic light emitting display device.

In the specification, in adding reference numerals for elements in each drawing, it should be noted that like reference numerals already used to denote like elements in other drawings are used for elements wherever possible.

The terms described in the specification should be understood as follows.

As used herein, the singular forms "a", "an" and "the" are intended to include the plural forms as well, unless the context clearly indicates otherwise. The terms "first" and "second" are for differentiating one element from the other element, and these elements should not be limited by these terms.

It will be further understood that the terms "comprises", "comprising,", "has", "having", "includes" and/or "including", when used herein, specify the presence of stated features, integers, steps, operations, elements, and/or components, but do not preclude the presence or addition of one or more other features, integers, steps, operations, elements, components, and/or groups thereof.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Hereinafter, embodiments of an organic light emitting display device according to the present invention will be described in detail with reference to the accompanying drawings.

Figure 2:
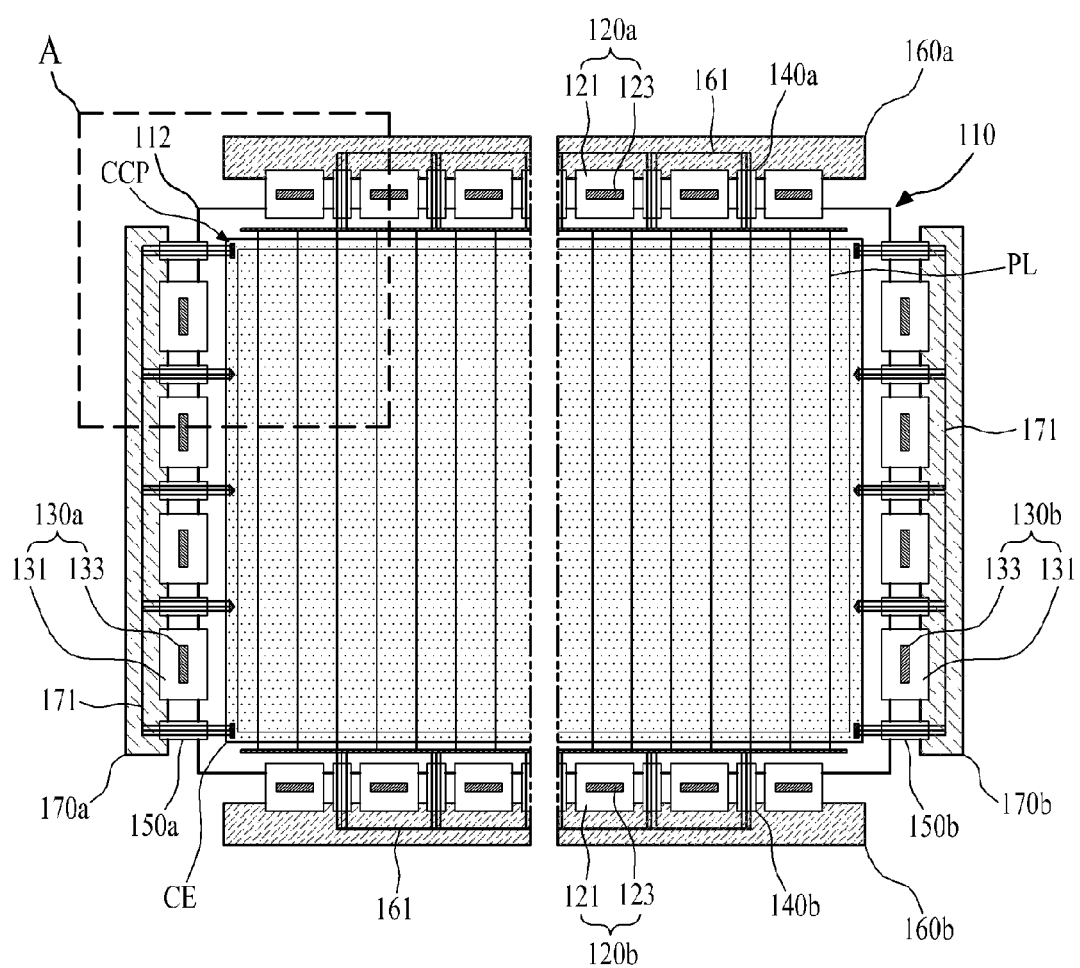
FIG. 2 is a plan view for describing an organic light emitting display device according to a first embodiment of the present invention.
Figure 3:
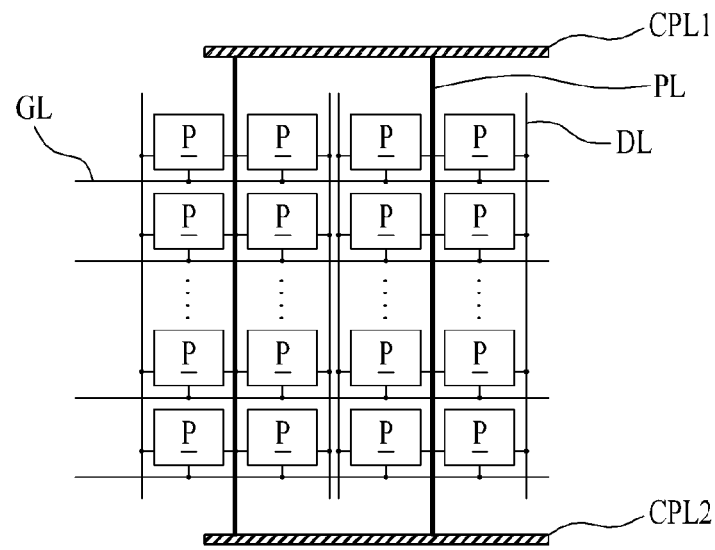
FIG. 3 is a view for describing a disposition structure of a driving power line according to the present invention.
Figure 4:
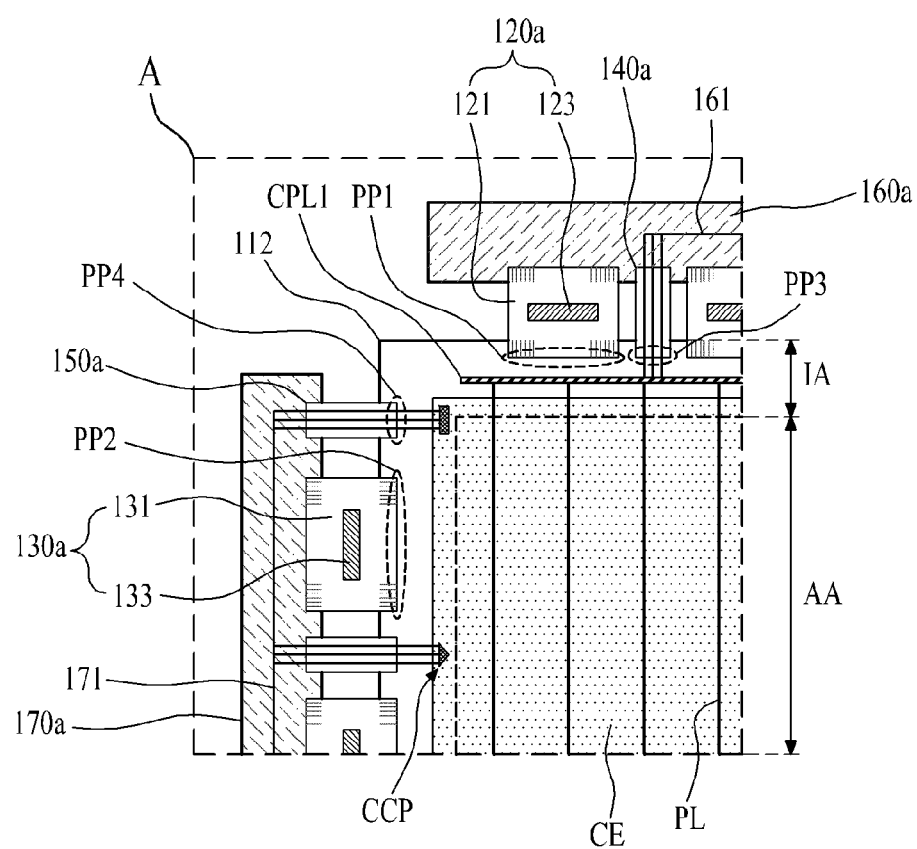
FIG. 4 is an enlarged view illustrating a portion A of FIG. 2.

FIG. 2 is a plan view for describing an organic light emitting display device according to a first embodiment of the present invention, FIG. 3 is a view for describing a disposition structure of a driving power line according to the present invention, and FIG. 4 is an enlarged view illustrating a portion A of FIG. 2.

Referring to FIGS. 2 to 4, the organic light emitting display device according to the first embodiment of the present invention includes a display panel 110, a plurality of first and second data drivers 120a and 120b, first and second gate drivers 130a and 130b, a plurality of upper and lower driving power supply members 140a and 140b, a plurality of first and second cathode power supply members 150a and 150b, first and second data printed circuit boards (PCBs) 160a and 160b, and first and second gate PCBs 170a and 170b.

The display panel 110 includes a first substrate 112, which has an active area AA and an inactive area IA near the active area AA, and a second substrate (not shown) that covers an area except a portion of the inactive area IA of the first substrate 112.

The first substrate 112 includes a plurality of data lines DL, a plurality of gate lines GL, a plurality of driving power lines PL, a plurality of pixels P, a cathode electrode layer CE, first and second common driving power lines CPL1 and CPL2, a plurality of cathode connection parts CCP, a plurality of first and second pad parts PP1 and PP2, a plurality of driving power pad parts PP3, and a plurality of cathode power pad parts PP4.

The plurality of data lines DL are arranged in parallel, at certain intervals, and along a first direction of the active area AA. Here, the first direction may be a direction parallel to a short side of the first substrate 112.

The plurality of gate lines GL are arranged in parallel, at certain intervals, and along a second direction intersecting the first direction.

The plurality of driving power lines PL are arranged in parallel with the plurality of data lines DL, at certain intervals, and along the first direction. That is, the plurality of driving power lines PL may be respectively formed between the plurality of data lines DL, but as illustrated in FIG. 3, each of the plurality of driving power lines PL may be formed to be shared by laterally adjacent pixels P.

The plurality of pixels P are respectively formed in a plurality of pixels areas defined by intersections between the plurality of data lines DL and the plurality of gate lines GL, and each of the plurality of pixels P is connected to adjacent data line DL and gate line GL and a corresponding driving power line PL. Each of the plurality of pixels P emits light with a current flowing from a corresponding driving power line PL to the cathode electrode layer CE in correspondence with a data voltage supplied to a corresponding data line DL in response to a gate pulse supplied to a corresponding gate line, thereby displaying an image. To this end, the plurality of pixels P are the same as those of FIG. 1, and thus, the description of FIG. 1 is applied to the plurality of pixels P.

A pixel circuit of each pixel P according to the present invention may further include a compensation circuit (not shown) that compensates for a threshold voltage of a driving thin film transistor (TFT), for preventing an image quality from being degraded by a threshold voltage deviation of the driving TFT.

The compensation circuit includes at least one compensation transistor (not shown) and at least one compensation capacitor (not shown) that are provided in the pixel circuit. The compensation circuit stores a data voltage and a threshold voltage of a driving TFT in a capacitor during a detection period in which the threshold voltage of the driving TFT is detected, thereby compensating for the threshold voltage of the driving TFT.

The cathode electrode layer CE, as in a dot hatching area of FIGS. 2 and 4, is formed to cover an area except a portion of the inactive area IA of the first substrate 112. The cathode electrode layer CE is connected to an organic layer of a light emitting element OLED formed in each pixel P, and supplies a cathode voltage to the organic layer.

The first common driving power line CPL1 is formed in the upper inactive area IA of the first substrate 112, and connected to upper sides of the plurality of driving power lines PL in common. The second common driving power line CPL2 is formed in the lower inactive area IA of the first substrate 112, and connected to lower sides of the plurality of driving power lines PL in common.

The plurality of cathode connection parts CCP are formed at certain intervals in the left and right inactive areas IA of the first substrate 112 to overlap the cathode electrode layer CE, and electrically connected to the cathode electrode layer CE through a contact hole (not shown). In this case, a first cathode connection part of the plurality of cathode connection parts CCP is connected to a left upper corner and right upper corner of the cathode electrode layer CE. Also, a last cathode connection part of the plurality of cathode connection parts CCP is connected to a left lower corner and right lower corner of the cathode electrode layer CE. Further, the cathode connection parts other than the first and last cathode connection parts are connected to a left edge and right edge of the cathode electrode layer CE, corresponding to respective spaces between the plurality of first pad parts PP1, at certain intervals.

A contact area between the cathode connection part CCP and the cathode electrode layer CE may be set to 10% to 90% of an overlapping area between the cathode connection part CCP and the cathode electrode layer CE. That is, when the contact area between the cathode connection part CCP and the cathode electrode layer CE is less than 10% of the overlapping area between the cathode connection part CCP and the cathode electrode layer CE, a resistance increases due to the narrow contact area between the cathode connection part CCP and the cathode electrode layer CE, and due to this, an amount of heating of the cathode connection part CCP and the cathode electrode layer CE increases, causing the cathode connection part CCP and the cathode electrode layer CE to be burned. In addition, when the contact area between the cathode connection part CCP and the cathode electrode layer CE exceeds 90% of the overlapping area between the cathode connection part CCP and the cathode electrode layer CE, it is not easy to bring the cathode connection part CCP into contact with the cathode electrode layer CE through a contact hole.

The plurality of first pad parts PP1 are arranged at certain intervals in each of the upper and lower inactive areas IA of the first substrate 112. Each of the plurality of first pad parts PP1 includes a plurality of data pads that are connected to both sides of a corresponding data line DL through a data link line (not shown).

The plurality of second pad parts PP2 are arranged at certain intervals in each of the left and right inactive areas IA of the first substrate 112. Each of the plurality of second pad parts PP2 includes a plurality of gate pads that are connected to both sides of a corresponding gate line DL through a gate link line (not shown).

The plurality of driving power pad parts PP3 are arranged in the respective inactive areas IA between the plurality of first pad parts PP1. Each of the plurality of driving power pad parts PP3 includes a driving power pad that is connected to the first common driving power line CPL1 through a driving power link line.

The plurality of cathode power pad parts PP4 are arranged in the respective inactive areas IA between the plurality of second pad parts PP2. Each of the plurality of cathode power pad parts PP4 includes a cathode power pad that is connected to the cathode connection part CCP through a cathode power link line.

The second substrate is formed in a plate shape of glass, plastic, or a metal material, and is facing-coupled to the first substrate 112, thus protecting an emission cell of each pixel P formed at the first substrate 112 from moisture, oxygen, etc. In this case, the second substrate is coupled by a sealing member (not shown) to a portion, except the plurality of first to fourth pad parts PP1 to PP4, of the inactive area IA of the first substrate 112, and surrounds the active area AA of the first substrate 112.

Each of the plurality of first data drivers 120a is connected to a first pad part PP1 provided in the upper inactive area IA of the first substrate 112, and supplies a data voltage to an upper side of a corresponding data line DL through the first pad part PP1 and a data link line. Each of the plurality of second data drivers 120b is connected to a first pad part PP1 provided in the lower inactive area IA of the first substrate 112, and supplies a data voltage to a lower side of a corresponding data line DL through the first pad part PP1 and a data link line. Each of the plurality of first and second data drivers 120a and 120b includes a data flexible circuit film 121 and a data driving integrated circuit (IC) 123.

The data flexible circuit film 121 is adhered to the first pad part PP1 to be electrically connected to the data pad by a tape automated boning (TAB) process. The data flexible circuit film 121 may be formed as a tape carrier package (TCP) or a chip on film (or a chip on flexible board, COF).

The data driving IC 123 is mounted on the data flexible circuit film 121, and connected to a corresponding data line DL through the data flexible circuit film 121, the data pad, and a data link line. The data driving IC 123 converts display data, which are input through the data flexible circuit film 121, into data voltages by using a data control signal and a plurality of reference gamma voltages which are input through the data flexible circuit film 121, and supplies the data voltages to the respective data lines DL. Therefore, the data driving IC 123 of each of the first and second data drivers 120a and 120b simultaneously supplies the same data voltage to an upper side and lower side of one data line DL, thus minimizing a drop of a data voltage in each data line DL.

Each of the plurality of first gate drivers 130a is connected to a second pad part PP2 provided in the left inactive area IA of the first substrate 112, and supplies the gate pulse to a corresponding gate line GL through the second pad part PP2 and a gate link line. Each of the plurality of second gate drivers 130b is connected to a second pad part PP2 provided in the right inactive area IA of the first substrate 112, and supplies the gate pulse to a corresponding gate line GL through the second pad part PP2 and a gate link line. Each of the plurality of first and second gate drivers 130a and 130b includes a gate flexible circuit film 131 and a gate driving IC 133.

The gate flexible circuit film 131 is adhered to the second pad part PP2 to be electrically connected to the gate pad by the TAB process. The gate flexible circuit film 131 may be formed as a TCP or a COF.

The gate driving IC 133 is mounted on the gate flexible circuit film 131, and connected to a corresponding gate line GL through the gate flexible circuit film 131, the gate pad, and a gate link line. The gate driving IC 133 generates the gate pulse according to a gate control signal input through the gate flexible circuit film 131, into data voltages by using a data control signal and a plurality of reference gamma voltages which are input through the gate flexible circuit film 131, and sequentially supplies the gate pulse to the plurality of gate lines GL. Therefore, the gate driving IC 133 of each of the first and second gate drivers 130a and 130b simultaneously supplies the same gate pulse to an upper side and lower side of one gate line GL, thus minimizing a voltage drop of the gate pulse in each gate line GL.

Each of the plurality of upper driving power supply members 140a is adhered to a driving power pad part PP3 provided in the upper inactive area IA of the first substrate 112. Each of the plurality of upper driving power supply members 140a is configured with a flexible circuit film including a plurality of driving power input lines connected to the driving power pad.

Each of the plurality of lower driving power supply members 140b is adhered by the TAB process to a driving power pad part PP3 provided in the lower inactive area IA of the first substrate 112. Each of the plurality of lower driving power supply members 140b is configured with a flexible circuit film including a plurality of driving power input lines connected to the driving power pad.

Each of the plurality of first cathode power supply members 150a is adhered to a cathode power pad part PP4 provided in the left inactive area IA of the first substrate 112. Each of the plurality of first cathode power supply members 150a is configured with a flexible circuit film including a plurality of cathode power input lines connected to the cathode power pad.

Each of the plurality of second cathode power supply members 150b is adhered by the TAB process to a cathode power pad part PP4 provided in the right inactive area IA of the first substrate 112. Each of the plurality of second cathode power supply members 150b is configured with a flexible circuit film including a plurality of cathode power input lines connected to the cathode power pad.

The first data PCB 160a is connected by the TAB process to the plurality of first data drivers 120a and the plurality of upper driving power supply members 140a in common The second data PCB 160b is connected by the TAB process to the plurality of second data drivers 120b and the plurality of lower driving power supply members 140b in common.

The first and second data PCBs 160a and 160b supply an external driving voltage to the plurality of upper and lower driving power supply members 140a and 140b, respectively. To this end, a driving power supply line 161, which is connected in common to a plurality of driving power input lines formed in each of the plurality of upper and lower driving power supply members 140a and 140b, is provided in each of the first and second data PCBs 160a and 160b. Therefore, the driving voltage is supplied to the first and second common driving power lines CPL1 and CPL2 through the plurality of upper and lower driving power supply members 140a and 140b, the driving power pad part PP3, and the driving power link line, and is supplied to the plurality of driving power lines PL through the respective first and second common driving power lines CPL1 and CPL2.

The first and second data PCBs 160a and 160b supply display data, a data control signal, and a plurality of reference gamma voltages, which are supplied from the outside, to the respective first and second data drivers 120a and 120b.

The first gate PCB 170a is connected by the TAB process to the plurality of first gate drivers 130a and the plurality of first cathode power supply members 150a in common. The first gate PCB 170a supplies a gate control signal, supplied from the outside, to the plurality of first gate drivers 130a, and supplies a cathode voltage, supplied from the outside, to the plurality of first cathode power supply members 150a.

The second gate PCB 170b is connected by the TAB process to the plurality of second gate drivers 130b and the plurality of second cathode power supply members 150b in common. The second gate PCB 170b supplies the gate control signal, supplied from the outside, to the plurality of second gate drivers 130b, and supplies the cathode voltage, supplied from the outside, to the plurality of second cathode power supply members 150b.

The organic light emitting display device according to the first embodiment of the present invention simultaneously supplies the driving voltage to the upper side and lower side of the driving power line PL, and thus can solve a problem of an image quality caused by the length and line resistance deviation of the driving power line PL.

Figure 5:
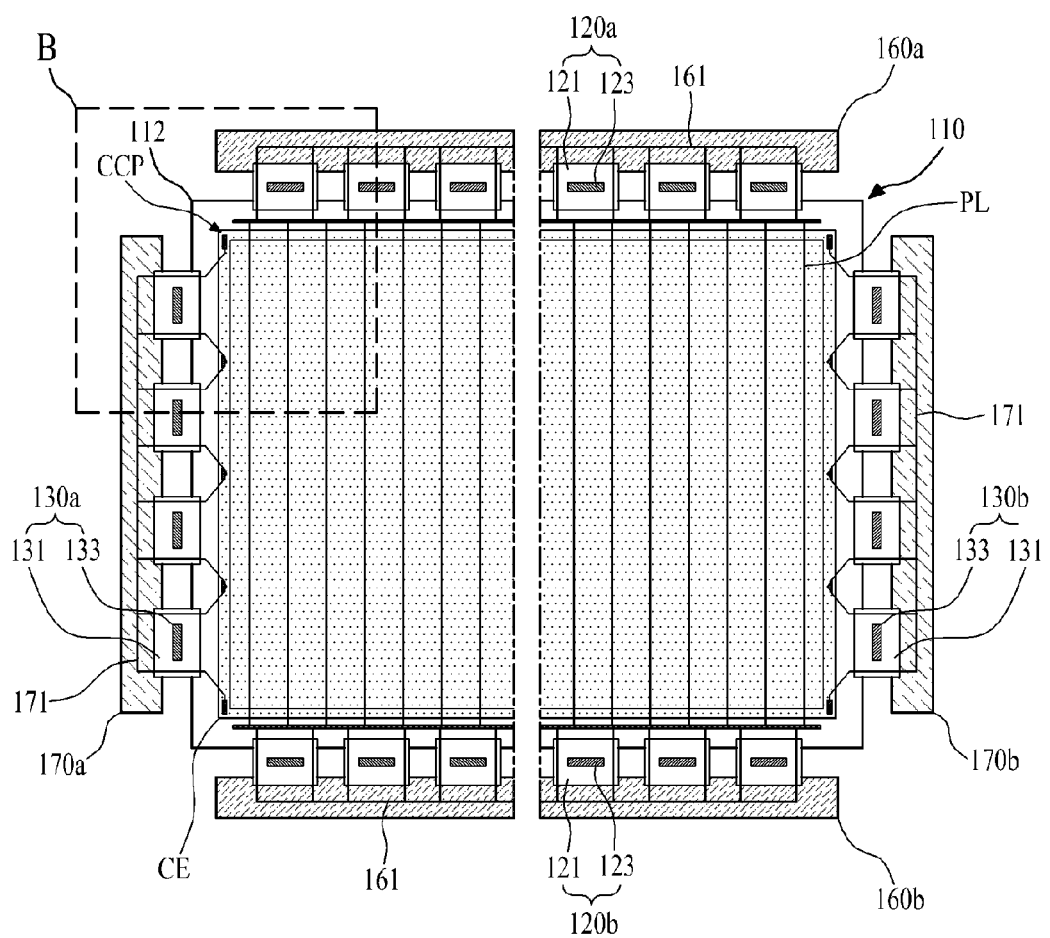
FIG. 5 is a plan view for describing an organic light emitting display device according to a second embodiment of the present invention.
Figure 6:
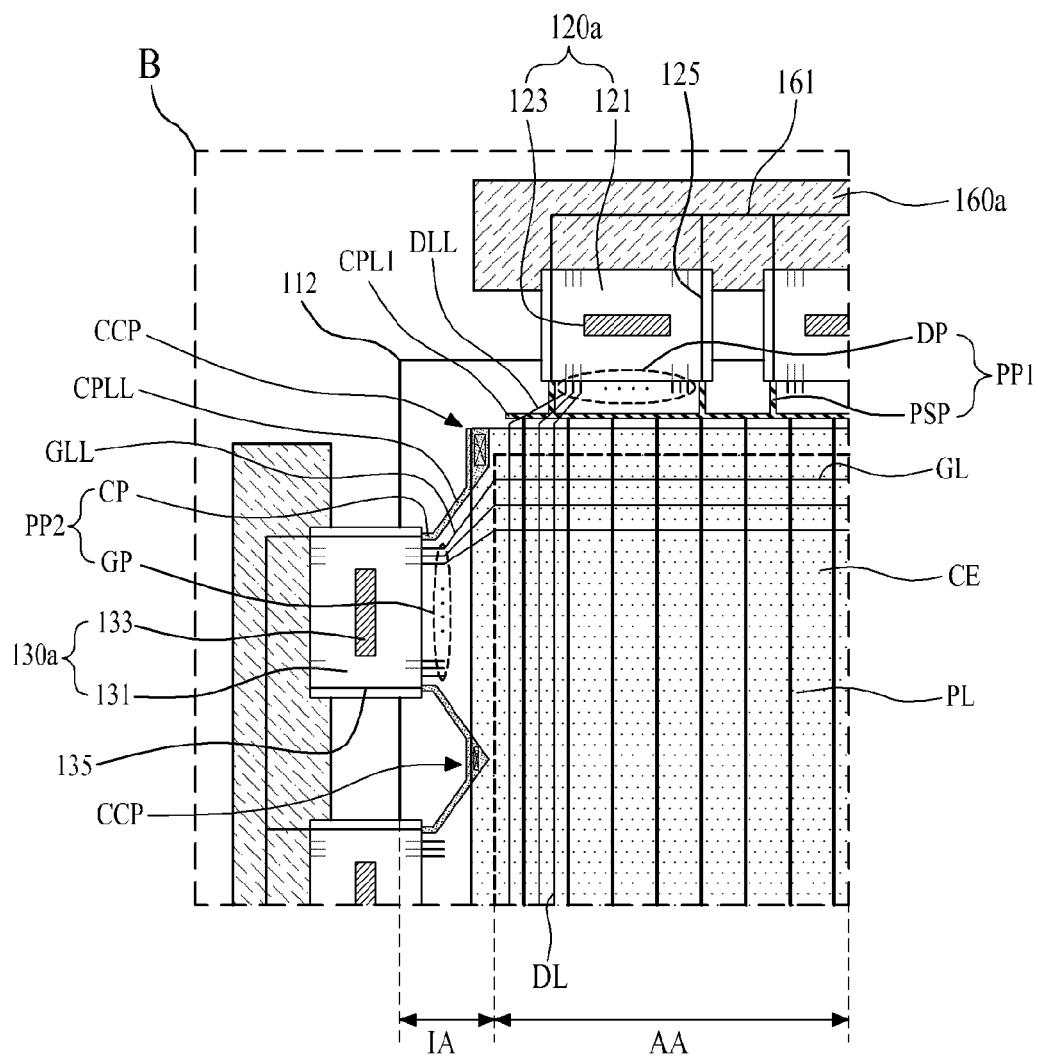
FIG. 6 is an enlarged view illustrating a portion B of FIG. 5.

FIG. 5 is a plan view for describing an organic light emitting display device according to a second embodiment of the present invention, and FIG. 6 is an enlarged view illustrating a portion B of FIG. 5.

Referring to FIGS. 5 and 6, the organic light emitting display device according to the second embodiment of the present invention includes a display panel 110, a plurality of first and second data drivers 120a and 120b, first and second gate drivers 130a and 130b, first and second data PCBs 160a and 160b, and first and second gate PCBs 170a and 170b.

Except that the plurality of power pad parts PP3 and the cathode power pad parts PP4 are removed from the above-described display panel of FIG. 4 and the plurality of first and second pad parts PP1 and PP2 are changed in structure, the display panel 110 is the same as the display panel of FIG. 4, and thus, only a plurality of first and second pad parts PP1 and PP2 will be described below.

The plurality of first pad parts PP1 are arranged at certain intervals in each of the upper and lower inactive areas IA of the first substrate 112. Each of the plurality of first pad parts PP1 includes a plurality of data pads DP, connected to the plurality of data lines DL, and a plurality of driving power pads PSP.

Each of the plurality of data pads DP is connected to a corresponding data line DL through a corresponding data link line DLL. Therefore, one data line DL is connected to a corresponding data pad DP through a corresponding data link line DL provided in each of the upper and lower inactive areas IA of the first substrate 112.

A plurality of driving power pads PSP are provided at both sides of the first pad part PP1 with the plurality of data pads DP therebetween to be connected to the first and second common driving power lines CPL1 and CPL2. Therefore, the first common driving power line CPL1 is connected in common to the plurality of driving power pads PSP provided in the upper inactive area IA of the first substrate 112, and the second common driving power line CPL2 is connected in common to the plurality of driving power pads PSP provided in the lower inactive area IA of the first substrate 112.

The plurality of second pad parts PP2 are arranged at certain intervals in each of the left and right inactive areas IA of the first substrate 112. Each of the plurality of second pad parts PP2 includes a plurality of gate pads GP, connected to the plurality of gate lines GL, and a plurality of cathode power pads CP.

Each of the plurality of gate pads GP is provided at both sides of the second pad part PP2 with the plurality of gate pads GP therebetween to be connected to a corresponding gate line GL through a corresponding gate link line GLL. Therefore, one gate line GL is connected to a corresponding gate pad GP through a corresponding gate link line GL provided in each of the left and right inactive areas IA of the first substrate 112.

The plurality of cathode power pads CP are connected to the above-described cathode connection part CCP through a cathode power link line CPLL.

Each of the plurality of first and second data drivers 120a and 120b includes a data flexible circuit film 121 adhered to the first pad part PP1 and a data driving IC 123 mounted on the data flexible circuit film 121. Except that a plurality of driving power input lines 125 provided at the data flexible circuit film 121 are added for supplying a driving voltage to the driving power pad PSP of the first pad part PP1, the plurality of first and second data drivers 120a and 120b are the same as the above-described data drivers of FIGS. 2 and 4. Therefore, the driving voltage is supplied to both sides of the driving power line PL through the plurality of driving power input lines 125, the driving power pad PSP, and the first and second common driving power lines CPL1 and CPL2.

Each of the plurality of first and second gate drivers 130a and 130b includes a gate flexible circuit film 131 adhered to the second pad part PP2 and a gate driving IC 133 mounted on the gate flexible circuit film 131. Except that the plurality of cathode power input lines 135 are added to the gate flexible circuit film 131 is added for supplying a cathode voltage to the cathode power pad CP of the second pad part PP2, the plurality of first and second gate drivers 130a and 130b are the same as the above-described gate drivers of FIGS. 2 and 4. Therefore, the cathode voltage is supplied to the cathode electrode layer CE through the plurality of cathode power input lines 135, the cathode power pad CP, and the cathode connection part CCP.

Except that each of the first and second data PCBs 160a and 160b supplies an external driving voltage to the plurality of driving power input lines 125 provided at the data flexible circuit film 121 of each of the plurality of data drivers 120a and 120b, the first and second data PCBs 160a and 160b are the same as the above-described first and second data PCBs of FIGS. 2 and 4, and thus, their repetitive description is not provided.

Except that each of the first and second gate PCBs 170a and 170b supplies an external cathode voltage to the plurality of cathode power input lines 135 provided at the gate flexible circuit film 131 of each of the plurality of gate drivers 130a and 130b, the first and second gate PCBs 170a and 170b are the same as the above-described first and second gate PCBs of FIGS. 2 and 4, and thus, their repetitive description is not provided.

Since the organic light emitting display device according to the second embodiment of the present invention simultaneously supplies the driving voltage to the upper side and lower side of the driving power line PL through the data flexible circuit film 121 of each of the data drivers 120a and 120b, the organic light emitting display device according to the second embodiment of the present invention provides the same effect as the above-described first embodiment of the present invention, and may not use the driving power supply members 140a and 140b and the cathode power supply members 150a and 150b.

Figure 7:
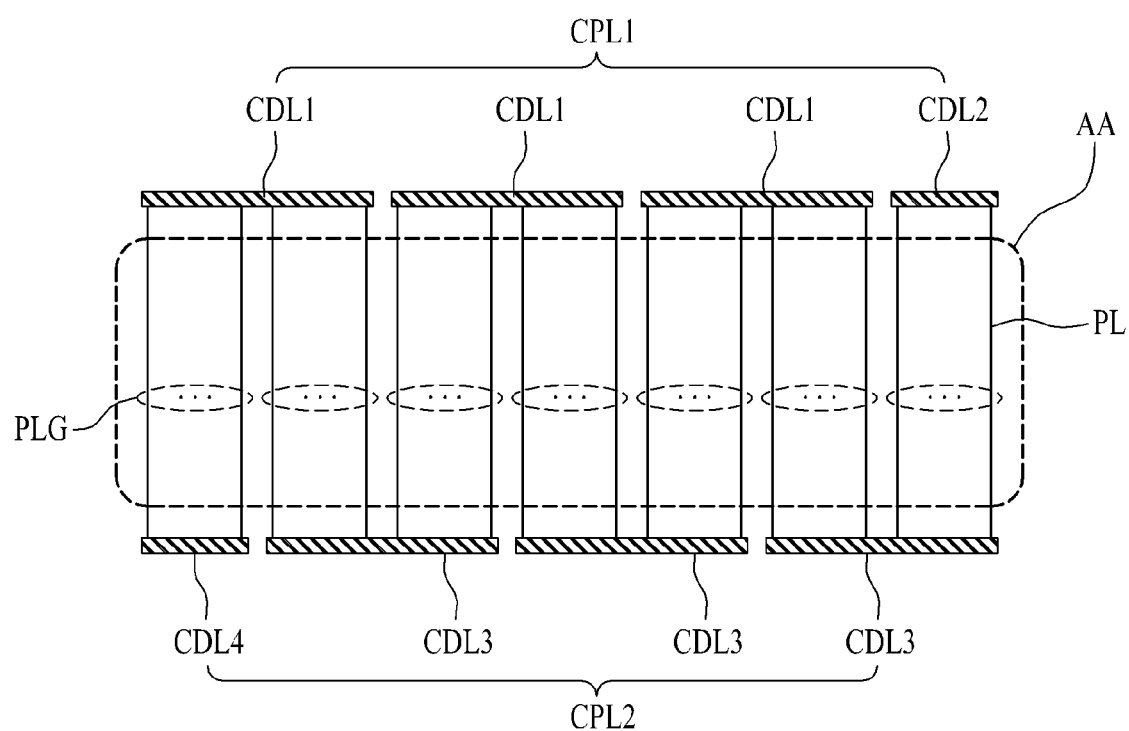
FIG. 7 is a view for describing a modification example of first and second common driving power lines in the organic light emitting display devices according the first and second embodiments of the present invention.

FIG. 7 is a view for describing a modification example of first and second common driving power lines in the organic light emitting display devices according the first and second embodiments of the present invention.

As seen in FIG. 7, the above-described driving power lines PL are grouped into a plurality of groups PLG in units of tens to hundreds of driving power lines PL, and each of the first and second common driving power lines CPL1 and CPL2 according to the present invention is divided into a plurality of common division lines. Therefore, one of an upper side and lower side of each of a plurality of driving power lines included in two adjacent groups PLG is connected to one common division line, and the other side is connected to two common division lines.

Specifically, the first common driving power line CPL1 according to the present invention includes a plurality of first common division lines CDL1 having a first length and a plurality of second common division lines CDL2 having a second length. Further, the second common driving power line CPL2 according to the present invention includes a plurality of third common division lines CDL3 having the first length and a plurality of fourth common division lines CDL4 having the second length.

Each of the plurality of first common division lines CDL1 is connected in common to an upper side of each of a plurality of driving power lines PL included in two adjacent groups PLG. Each of the plurality of second common division lines CDL2 is connected in common to an upper side of each of a plurality of driving power lines PL included in one group PLG.

Each of the plurality of third common division lines CDL3 is connected in common to a lower side of each of a plurality of driving power lines PL connected to the plurality of first common division lines CDL1. The fourth common division line CDL4 is connected in common to a lower side of each of a plurality of driving power lines PL included in the other group, which is not connected to the third common division line CDL3, of the two adjacent groups PLG connected to the first common division line CDL1. Therefore, the plurality of groups PLG are connected to the first and second common driving power lines CPL1 and CPL2 in zigzags.

The driving voltage may be supplied from one driving power supply member 140a or two adjacent driving power supply members 140a to one first common division line CDL1 and one third common division line CDL3, or the driving voltage may be supplied from one data flexible circuit film 121 or two adjacent data flexible circuit films 121 to one first common division line CDL1 and one third common division line CDL3. In addition, the driving voltage may be supplied from one driving power supply member 140a or one data flexible circuit film 121 to each of the second and fourth common division lines CDL2 and CDL4.

In the organic light emitting display device of the present invention including the first and second common driving power lines according to the above-described modification example, the plurality of driving power lines PL are connected in zigzags to the first and second common driving power lines CPL1 and CPL2 by the divided plurality of common division lines CDL1 to CDL4, a burning of the common driving power lines CPL1 and CPL2 caused by a defective pattern, a foreign material, or a static electricity can be prevented from being spread.

Figure 8:
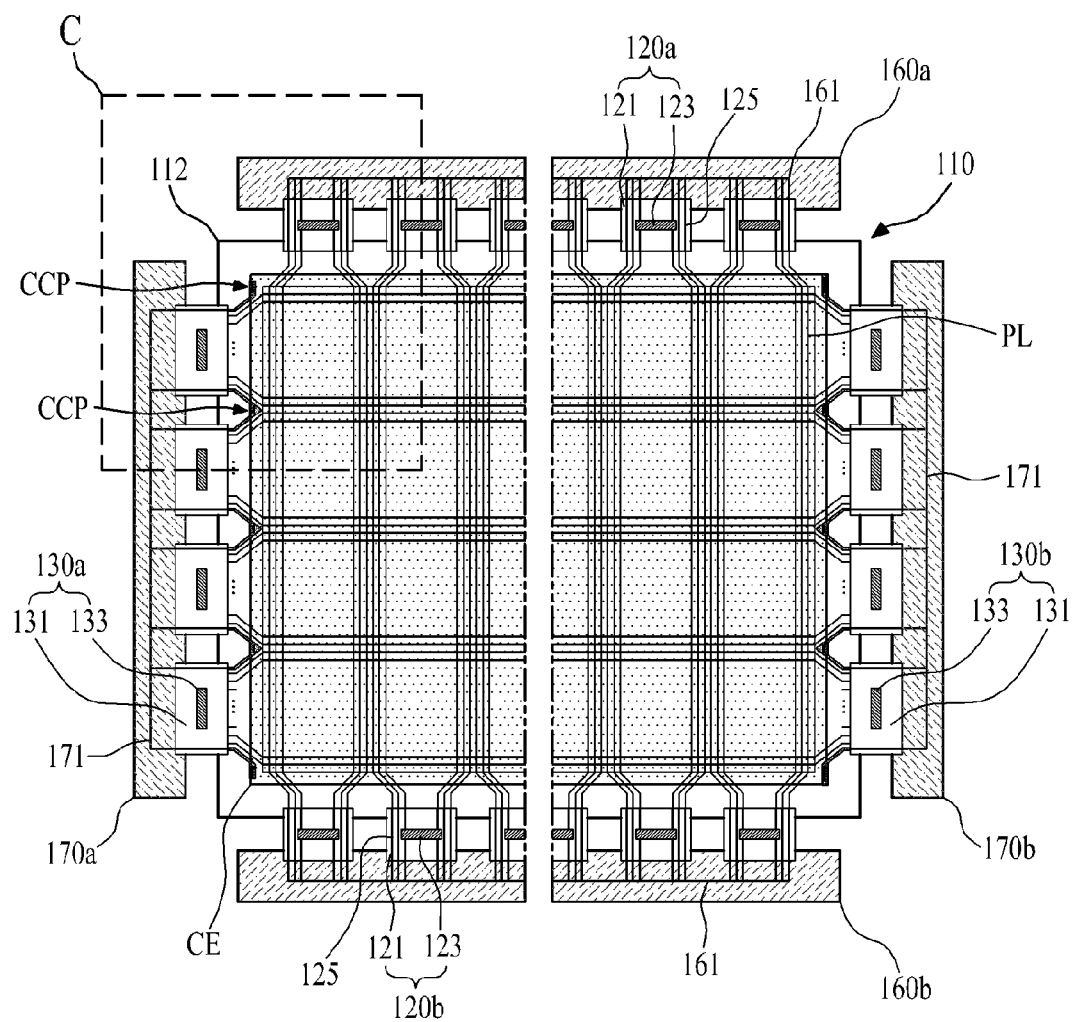
FIG. 8 is a plan view for describing an organic light emitting display device according to a third embodiment of the present invention.
Figure 9:
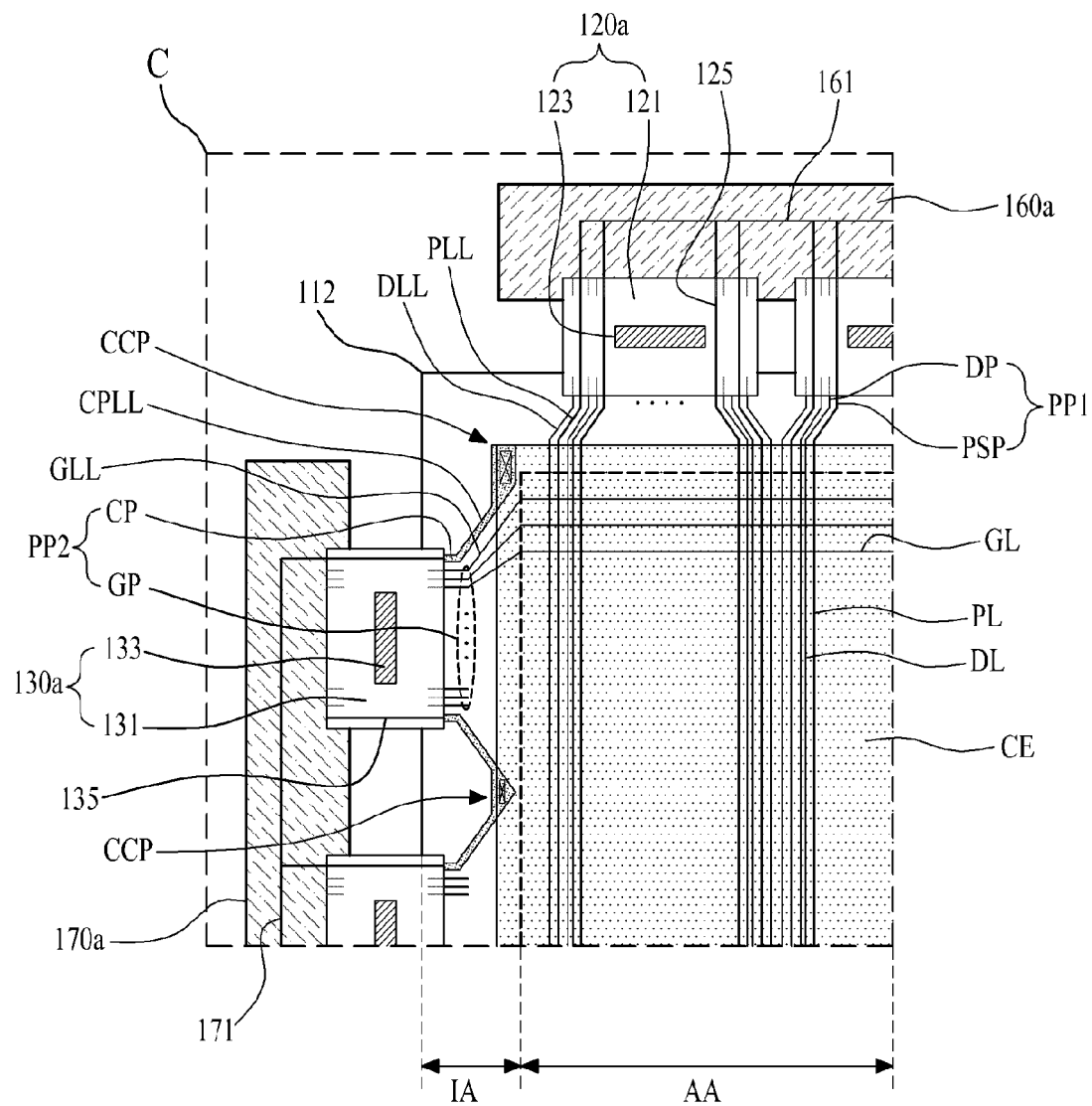
FIG. 9 is an enlarged view illustrating a portion C of FIG. 8.

FIG. 8 is a plan view for describing an organic light emitting display device according to a third embodiment of the present invention, and FIG. 9 is an enlarged view illustrating a portion C of FIG. 8.

Referring to FIGS. 8 and 9, the organic light emitting display device according to the third embodiment of the present invention is configured by removing the first and second common power lines from the organic light emitting display device according to the second embodiment of the present invention, and a repetitive description on the elements other than a first pad part PP1, a plurality of data drivers 120a and 120b, and a plurality of data PCBs 160a and 160b is not provided.

The first pad part PP1 is provided in each of the upper and lower inactive areas IA of the first substrate 112. The first pad part PP1 includes a plurality of data pads DP, connected to the plurality of data lines DL, and a plurality of driving power pads PSP connected to a plurality of driving power lines PL.

Each of the plurality of data pads DP is connected to a corresponding data line DL through a data link line DLL.

The plurality of driving power pads PSP are connected to a corresponding driving power line PL through a driving power link line PLL. In this case, the plurality of driving power pads PSP may be respectively provided between the plurality of data pads DP, and respectively provided between two data pads DP, depending on a position of each of the plurality of driving power lines PL provided in the active area AA.

Each of the plurality of first and second data drivers 120a and 120b includes a data flexible circuit film 121 adhered to the first pad part PP1 and a data driving IC 123 mounted on the data flexible circuit film 121. Except that a plurality of driving power input lines 125 provided at the data flexible circuit film 121 are added for supplying a driving voltage to the plurality of driving power pads PSP, the plurality of first and second data drivers 120a and 120b are the same as the above-described data drivers of FIGS. 2 and 4. Therefore, the driving voltage is supplied to both sides of a corresponding driving power line PL through a driving power pad PSP, connected to each of the plurality of driving power input lines 125, and a driving power link line PLL.

Except that each of the first and second data PCBs 160a and 160b supplies an external driving voltage to the plurality of driving power input lines 125 provided at the data flexible circuit film 121 of each of the plurality of data drivers 120a and 120b, the first and second data PCBs 160a and 160b are the same as the above-described first and second data PCBs of FIGS. 2 and 4, and thus, their repetitive description is not provided.

Since the organic light emitting display device according to the third embodiment of the present invention simultaneously supplies the driving voltage to the upper side and lower side of the driving power line PL through the data flexible circuit film 121 of each of the data drivers 120a and 120b, the organic light emitting display device according to the third embodiment of the present invention provides the same effect as the above-described second embodiment of the present invention, and may not use the first and second common driving power lines CPL1 and CPL2. Accordingly, a burning of the common driving power line is prevented.

Figure 10:
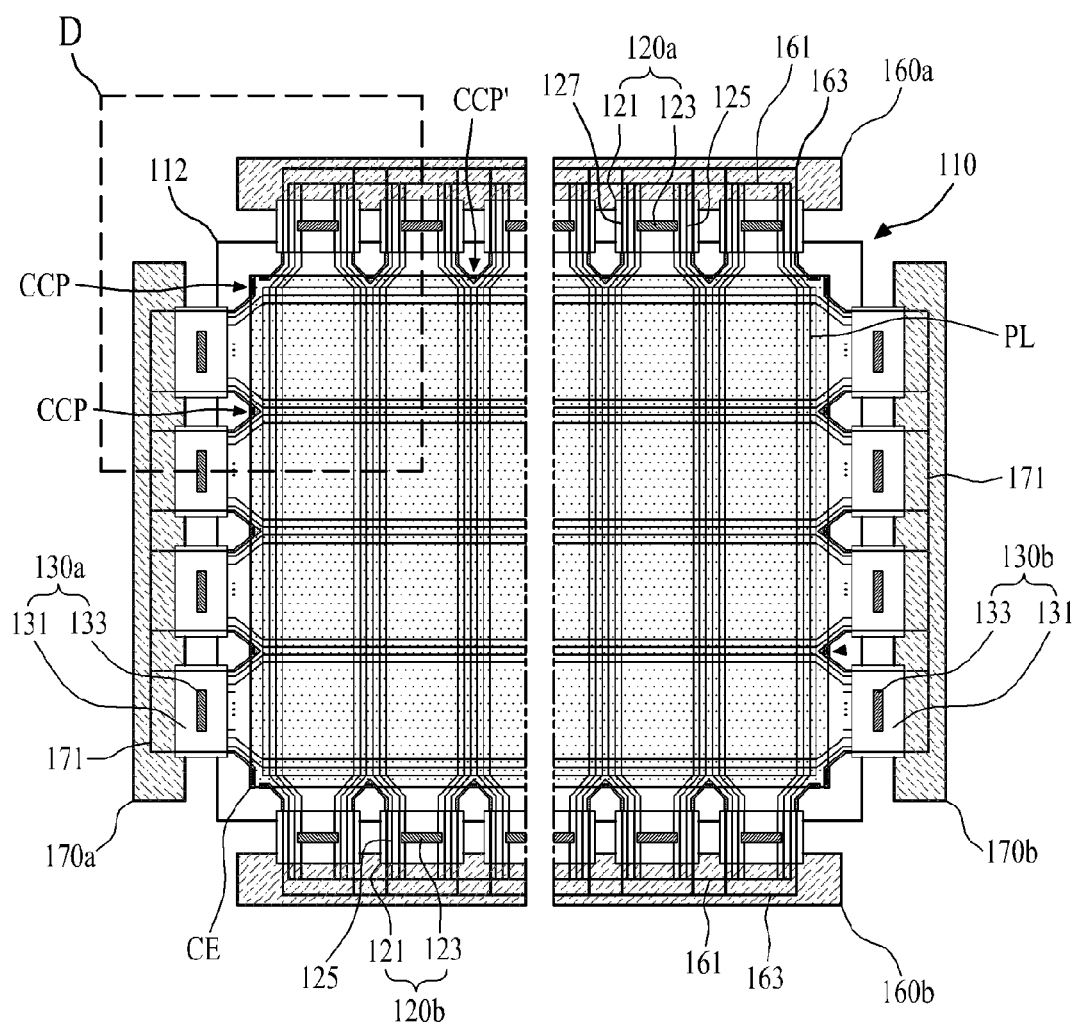
FIG. 10 is a plan view for describing an organic light emitting display device according to a fourth embodiment of the present invention.
Figure 11:
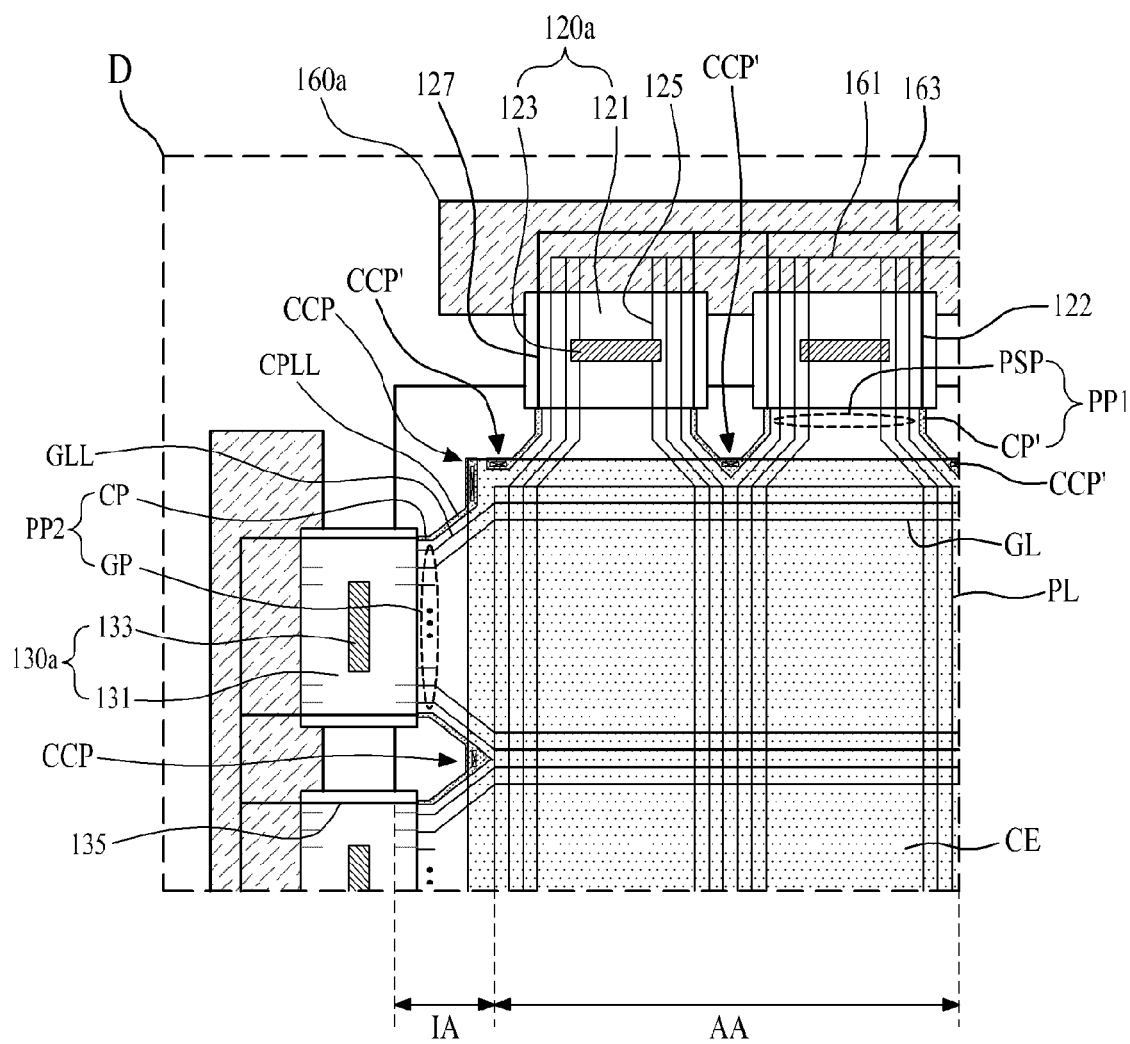
FIG. 11 is an enlarged view illustrating a portion D of FIG. 10.

FIG. 10 is a plan view for describing an organic light emitting display device according to a fourth embodiment of the present invention, and FIG. 11 is an enlarged view illustrating a portion D of FIG. 10.

Referring to FIGS. 10 and 11, the organic light emitting display device according to the fourth embodiment of the present invention is configured by adding a dummy cathode connection part CCP' to the organic light emitting display device according to the third embodiment of the present invention, and a repetitive description on the elements other than a first pad part PP1, a plurality of data drivers 120a and 120b, and a plurality of data PCBs 160a and 160b is not provided.

The first pad part PP1 is provided in each of the upper and lower inactive areas IA of the first substrate 112. The first pad part PP1 includes a plurality of data pads (not shown) connected to the plurality of data lines (not shown), a plurality of driving power pads PSP connected to a plurality of driving power lines PL, and a plurality of dummy cathode power pads CP'.

The plurality of data pads and the plurality of driving power pads PSP are provided identically to the above-described third embodiment of the present invention.

Each of the plurality of dummy cathode power pads CP' is provided at both sides of the first pad part PP1, and electrically connected to the dummy cathode connection part CCP'. A pair of dummy cathode power pads CP' are provided at each of the plurality of first pad parts PP1.

Each of the plurality of dummy cathode connection parts CCP' is provided in the upper and lower inactive areas IA of the first substrate 112, electrically connected to the dummy cathode power pad CP', and electrically connected to an upper edge and lower edge of the cathode electrode layer CE with a certain interval. In this case, a first cathode connection part of the plurality of dummy cathode connection parts CCP' is connected to the left upper corner and right upper corner of the cathode electrode layer CE. Also, a last cathode connection part of the plurality of dummy cathode connection parts CCP' is connected to the left lower corner and right lower corner of the cathode electrode layer CE. Further, the dummy cathode connection parts other than the first and last dummy cathode connection parts are connected to the upper edge and lower edge of the cathode electrode layer CE, corresponding to respective spaces between the plurality of first pad parts PP1, at certain intervals.

Each of the plurality of dummy cathode connection parts CCP' supplies a cathode voltage, supplied from the dummy cathode power pad CP' of the first pad part PP1, to the upper edge and lower edge of the cathode electrode layer CE. For the same reason as the above-described cathode connection part CCP, a contact area between the dummy cathode connection part CCP' and the cathode electrode layer CE may be set to 10% to 90% of an overlapping area between the dummy cathode connection part CCP' and the cathode electrode layer CE.

Except that a plurality of cathode power input lines 127 provided at the data flexible circuit film 121 are added for supplying the cathode voltage to the dummy cathode power pad CP' of the first pad part PP1, the plurality of first and second data drivers 120a and 120b are configured identically to the above-described third embodiment of the present invention. Therefore, the cathode voltage is supplied to the dummy cathode connection part CCP' through the dummy cathode power pad CP' connected to the cathode power input lines 127.

Except that a cathode power supply line 163 is added for additionally supplying an external cathode voltage to the plurality of cathode power input lines 127 provided at the data flexible circuit film 121, the plurality of first and second data PCBs 160a and 160b are configured identically to the above-described third embodiment of the present invention.

The organic light emitting display device according to the fourth embodiment of the present invention provides the same effect as the above-described third embodiment of the present invention, and moreover, since the cathode voltage is supplied to the upper, lower, left, and right edges of the cathode electrode layer CE through the cathode connection part CCP and the dummy cathode connection part CCP', the voltage of the cathode electrode layer CE can be maintained at a constant level.

Figure 12:
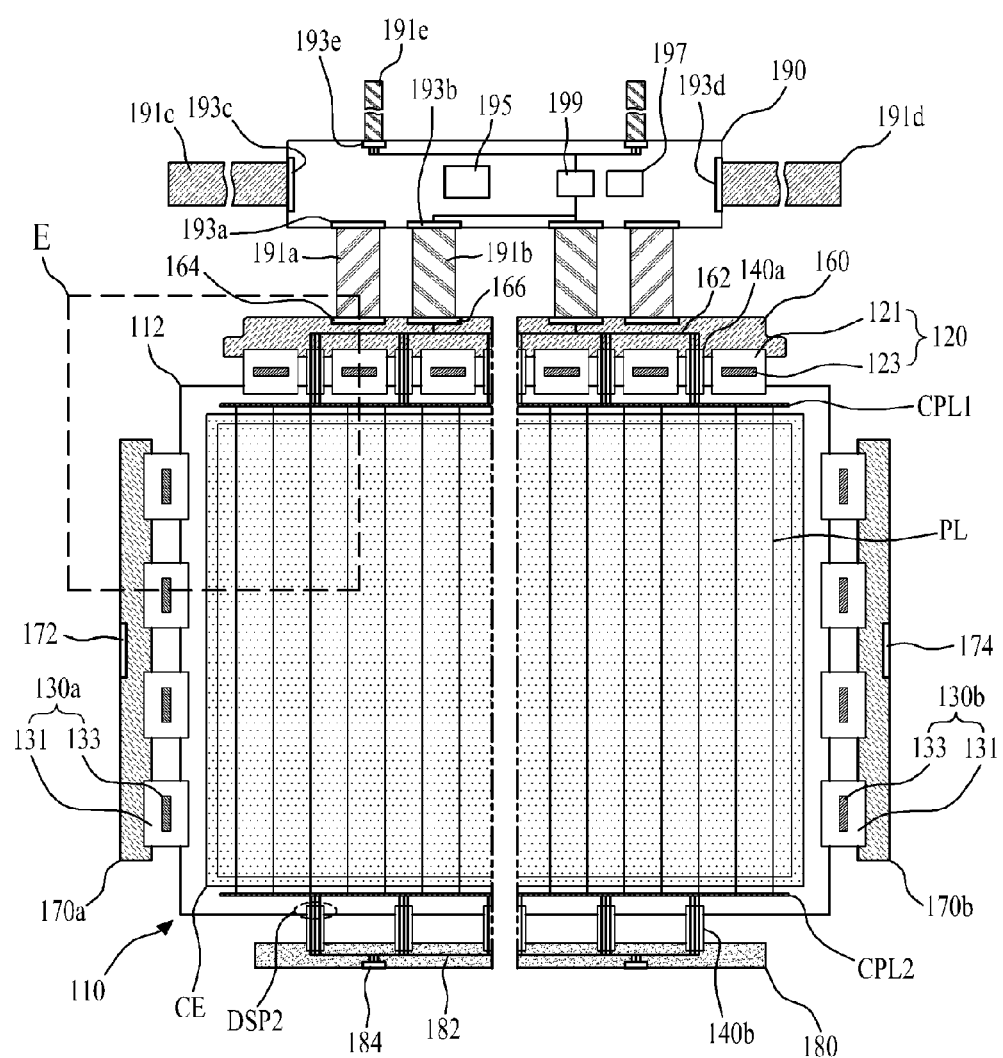
FIG. 12 is a plan view for describing an organic light emitting display device according to a fifth embodiment of the present invention.
Figure 13:
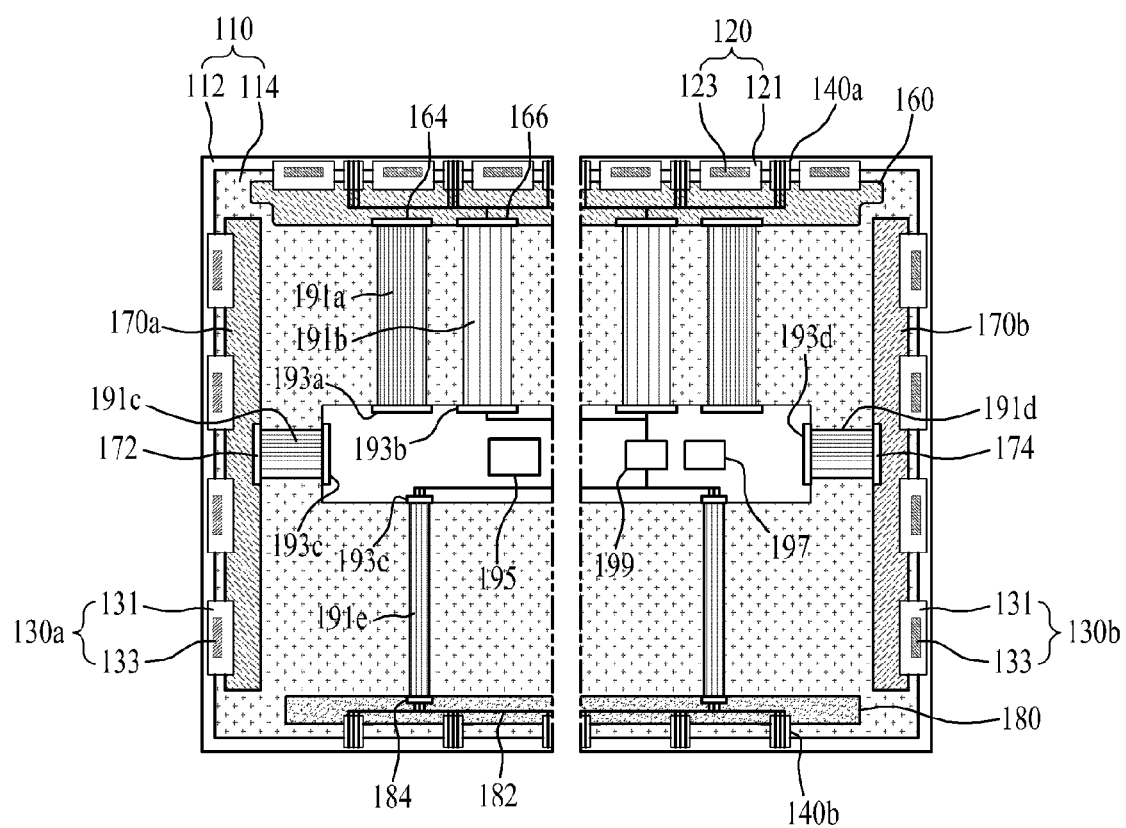
FIG. 13 is a rear view for describing an organic light emitting display device according to the fifth embodiment of the present invention.
Figure 14:
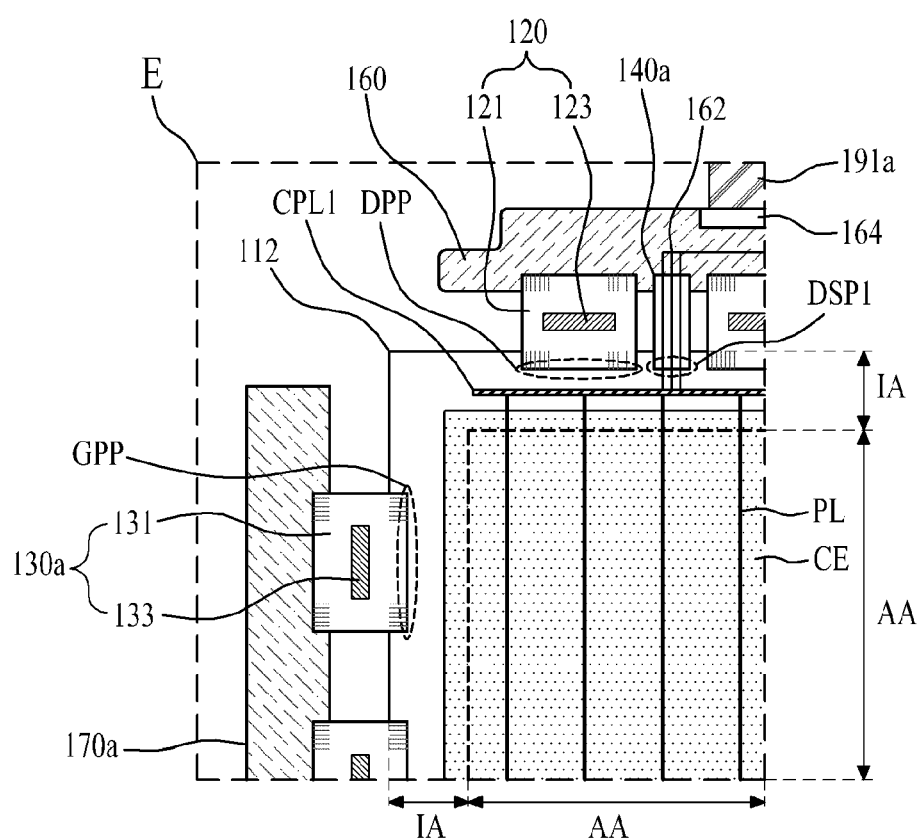
FIG. 14 is an enlarged view illustrating a portion E of FIG. 12.

FIG. 12 is a plan view for describing an organic light emitting display device according to a fifth embodiment of the present invention, FIG. 13 is a rear view for describing an organic light emitting display device according to the fifth embodiment of the present invention, and FIG. 14 is an enlarged view illustrating a portion E of FIG. 12.

Referring to FIGS. 12 to 14, the organic light emitting display device according to the fifth embodiment of the present invention includes a display panel 110, a plurality of data drivers 120, a plurality of first and second gate drivers 130a and 130b, a plurality of upper and lower driving power supply members 140a and 140b, a data PCB 160, first and second gate PCBs 170a and 170b, a driving power transfer board 180, and a control board 190.

The display panel 110 includes a first substrate 112, which has an active area AA and an inactive area IA near the active area AA, and a second substrate 114 that covers an area except a portion of the inactive area IA of the first substrate 112.

The first substrate 112 includes a plurality of data lines DL, a plurality of gate lines GL, a plurality of driving power lines PL, a plurality of pixels P, a cathode electrode layer CE, first and second common driving power lines CPL1 and CPL2, a plurality of data pad parts DPP, a plurality of gate pad parts GPP, and a plurality of upper and lower driving power pad parts DSP1 and DSP2.

The plurality of data lines DL, the plurality of gate lines GL, the plurality of driving power lines PL, the plurality of pixels P, the cathode electrode layer CE, the first and second common driving power lines CPL1 and CPL2 are the same as the first substrate 112 of FIGS. 2 to 5, and thus, their repetitive description is not provided.

The plurality of data pad parts DPP are arranged at certain intervals in an upper inactive area IA of the first substrate 112. Each of the plurality of data pad parts DPP includes a plurality of data pads connected to both sides of a corresponding data line DL through a data link line (not shown).

The plurality of gate pad parts GPP are arranged at certain intervals in left and right inactive areas IA of the first substrate 112. Each of the plurality of gate pad parts GPP includes a plurality of gate pads connected to both sides of a corresponding gate line GL through a gate link line (not shown).

The plurality of upper driving power pad parts DSP1 are respectively provided between the plurality of data pad parts DPP provided at the first substrate 112, in an upper inactive area IA. Each of the plurality of upper driving power pad parts DSP1 includes a plurality of upper driving power pads, which are connected in common to the first common driving power line CPL1 through a driving power link line.

The plurality of lower driving power pad parts DSP2 are provided in a lower inactive area IA of the first substrate 112. Each of the plurality of lower driving power pad parts DSP2 includes a plurality of lower driving power pads, which are connected in common to the second common driving power line CPL2 through a driving power link line.

The second substrate 114 is formed in a plate shape of glass, plastic, or a metal material, and is facing-coupled to the first substrate 112, thus protecting an emission cell of each pixel P formed at the first substrate 112 from moisture, oxygen, etc. In this case, the second substrate 114 is coupled by a sealing member (not shown) to a portion, except the pad parts DPP, GPP, DSP1 and DSP2, of the inactive area IA of the first substrate 112, and surrounds the active area AA of the first substrate 112.

Each of the plurality of data drivers 120 is connected to a data pad part DPP provided in the upper inactive area IA of the first substrate 112, and supplies a data voltage to a corresponding data line DL through the data pad part DPP and a data link line. Each of the plurality of data drivers 120 includes a data flexible circuit film 121 and a data driving IC 123.

The data flexible circuit film 121 is adhered to the data pad part DPP to be electrically connected to the data pad by the TAB process. The data flexible circuit film 121 may be formed as the TCP or the COF.

The data driving IC 123 is mounted on the data flexible circuit film 121, and connected to a corresponding data line DL through the data flexible circuit film 121, the data pad, and a data link line. The data driving IC 123 converts display data, which are input through the data flexible circuit film 121, into data voltages by using a data control signal and a plurality of reference gamma voltages which are input through the data flexible circuit film 121, and supplies the data voltages to the respective data lines DL.

The plurality of first and second gate drivers 130a and 130b are the same as the first and second gate drivers 130a and 130b of FIGS. 2 to 5, and thus, their repetitive description is not provided.

Each of the plurality of upper driving power supply members 140a is adhered to the upper driving power pad part DSP1 provided in the upper inactive area IA of the first substrate 112. Each of the plurality of upper driving power supply members 140a is configured with a flexible circuit film including a plurality of driving power input lines connected to the upper driving power pads of each of the plurality of upper driving power pad parts DSP1.

Each of the plurality of lower driving power supply members 140b is adhered to the lower driving power pad part DSP2 provided in the lower inactive area IA of the first substrate 112. Each of the plurality of lower driving power supply members 140b is configured with a flexible circuit film including a plurality of driving power input lines connected to the lower driving power pads of each of the plurality of lower driving power pad parts DSP2.

When the organic light emitting display device according to the present invention has a bottom emission type, as illustrated in FIG. 13, the plurality of data flexible circuit films 121, the plurality of gate flexible circuit films 131, and the plurality of upper and lower driving power supply members 140a and 140b are disposed at a rear surface of the second substrate 114 with respect to a front surface of the first substrate 112. Also, when the organic light emitting display device according to the present invention has the bottom emission type, although not shown, the plurality of data flexible circuit films 121, the plurality of gate flexible circuit films 131, and the plurality of upper and lower driving power supply members 140a and 140b are bent and disposed at a rear surface of the second substrate 114 to surround a side surface of the first substrate 112.

The data PCB 160 is connected by the TAB process to the plurality of data drivers 120 and the plurality of upper driving power supply members 140a in common.

The data PCB 160 supplies a driving voltage, supplied from the control board 190, to the plurality of upper driving power supply member 140. To this end, a first driving power supply line 162, which is connected in common to a plurality of driving power input lines formed at each of the plurality of upper driving power supply members 140a, is provided at each of the data PCB 160. Therefore, the driving voltage is supplied to the first common driving power lines CPL1 through the first driving power supply line 162, the plurality of upper driving power supply members 140a, the upper driving power pad part DSP1, and the driving power link line, and then is supplied to an upper side of each of the plurality of driving power lines PL through the first common driving power line CPL1.

The data PCB 160 supplies display data, a data control signal, and a plurality of reference gamma voltages, which are supplied from the control board 190, to the plurality of data drivers 120.

The first gate PCB 170a is connected by the TAB process to a gate flexible circuit film of each of the plurality of first gate drivers 130a. The first gate PCB 170a supplies a gate control signal, supplied from the control board 190, to a corresponding gate driving IC 133 of each of the plurality of first gate drivers 130a.

The second gate PCB 170b is connected by the TAB process to a gate flexible circuit film of each of the plurality of second gate drivers 130b. The second gate PCB 170b supplies the gate control signal, supplied from the control board 190, to a corresponding gate driving IC 133 of each of the plurality of second gate drivers 130b.

The driving power transfer board 180 is connected by the TAB process to the plurality of lower driving power supply members 140b in common, and supplies the driving voltage, supplied from the control board 190, to the plurality of lower driving power supply members 140b. To this end, a second driving power supply line 182, which is connected in common to a plurality of driving power input lines formed at each of the plurality of lower driving power supply members 140b, is provided at the driving power transfer board 180. Therefore, the driving voltage is supplied to the second common driving power lines CPL2 through the second driving power supply line 182, the plurality of lower driving power supply members 140b, the lower driving power pad part DSP2, and the driving power link line, and then is supplied to a lower side of each of the plurality of driving power lines PL through the second common driving power line CPL2.

The control board 190 is connected to the data PCB 160 through a plurality of first and second signal transfer films 191a and 191b, connected to a first gate PCB 170a through a plurality of third signal transfer films 191c, connected to a second gate PCB 170b through a plurality of fourth signal transfer films 191d, and connected to the driving power transfer board 180 through a pair of fifth signal transfer films 191e.

A plurality of first and second connectors 193a and 193b respectively connected to the plurality of first and second signal transfer films 191a and 191b, third and fourth connectors 193c and 193d respectively connected to the plurality of third and fourth signal transfer films 191c and 191d, and a pair of fifth connectors 193e connected to the pair of fifth signal transfer films 191e are mounted on the control board 190.

Moreover, a timing controller 195, a reference gamma voltage generator 197, and a power supply 199 are mounted on the control board 190.

The timing controller 195 aligns video data, supplied from an external system body (not shown) or a graphics card (not shown) through a user connector (not shown) mounted on the control board 190, to be suitable for a driving of the display panel 110 to generate the display data, and generates a data control signal and a gate control signal based on a timing sync signal supplied through the user connector (not shown).

The reference gamma voltage generator 197 generates a plurality of reference gamma voltages having different voltage levels by using an input voltage which is supplied through the user connector or a power connector (not shown) mounted on the control board 190.

The power supply 199 generates the driving voltage and various circuit driving voltages necessary to drive the organic light emitting display device by using the input voltage supplied through the power connector (not shown).

The display data, the data control signal, the plurality of reference gamma voltages, and the various circuit driving voltages are supplied to the data driving IC 123 through the control board 190, the first connector 193a, a sixth connector 164 mounted on the data PCB 160, the data PCB 160, and the data flexible circuit film 121.

The gate control signal and the various circuit driving voltages are supplied to the gate driving IC 133 of each of the plurality of first gate drivers 130a through the control board 190, the third connector 193c, a seventh connector 172 mounted on the first gate PCB 170a, and the first gate PCB 170a. Simultaneously, the gate control signal and the various circuit driving voltages are supplied to the gate driving IC 133 of each of the plurality of second gate drivers 130b through the control board 190, the fourth connector 193d, an eighth connector 174 mounted on the second gate PCB 170b, and the second gate PCB 170b.

The driving voltage is supplied to an upper side of each of the plurality of driving power lines PL through the control board 190, the second connector 193b, a ninth connector 166 and the first driving power supply line 162 which are mounted on the data PCB 160, the upper driving power supply member 140a, the upper driving power pad parts DSP1, and the first common driving power line CPL1. Simultaneously, the driving voltage is supplied to a lower side of each of the plurality of driving power lines PL through the control board 190, the fifth connector 193e, a tenth connector 184 and the second driving power supply line 182 which are mounted on the data PCB 160, the lower driving power supply member 140b, the lower driving power pad parts DSP2, and the second common driving power line CPL2. Therefore, the driving voltage is supplied to the upper side and lower side of each of the plurality of driving power lines PL formed at the display panel 110.

The data PCB 160, the first and second gate PCBs 170a and 170b, the driving power transfer board 180, and the control board 190 may be disposed at a rear surface of the second substrate 114 or a rear surface of the first substrate 112 depending on an emission type of the organic light emitting display device according to the present invention.

The organic light emitting display device according to the fifth embodiment of the present invention simultaneously supplies the driving voltage to the upper side and lower side of the driving power line PL, and thus can solve a problem of an image quality caused by the length and line resistance deviation of the driving power line PL.

Figure 15:
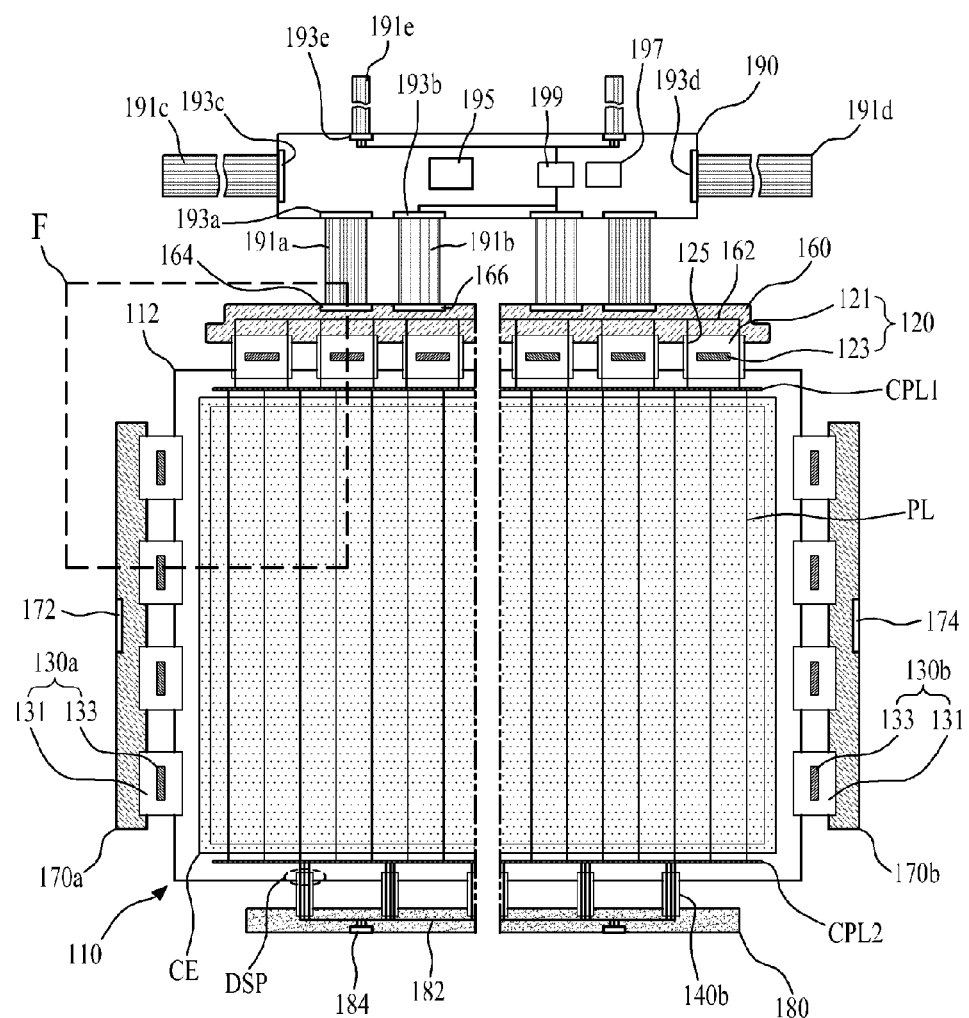
FIG. 15 is a plan view for describing an organic light emitting display device according to a sixth embodiment of the present invention.
Figure 16:
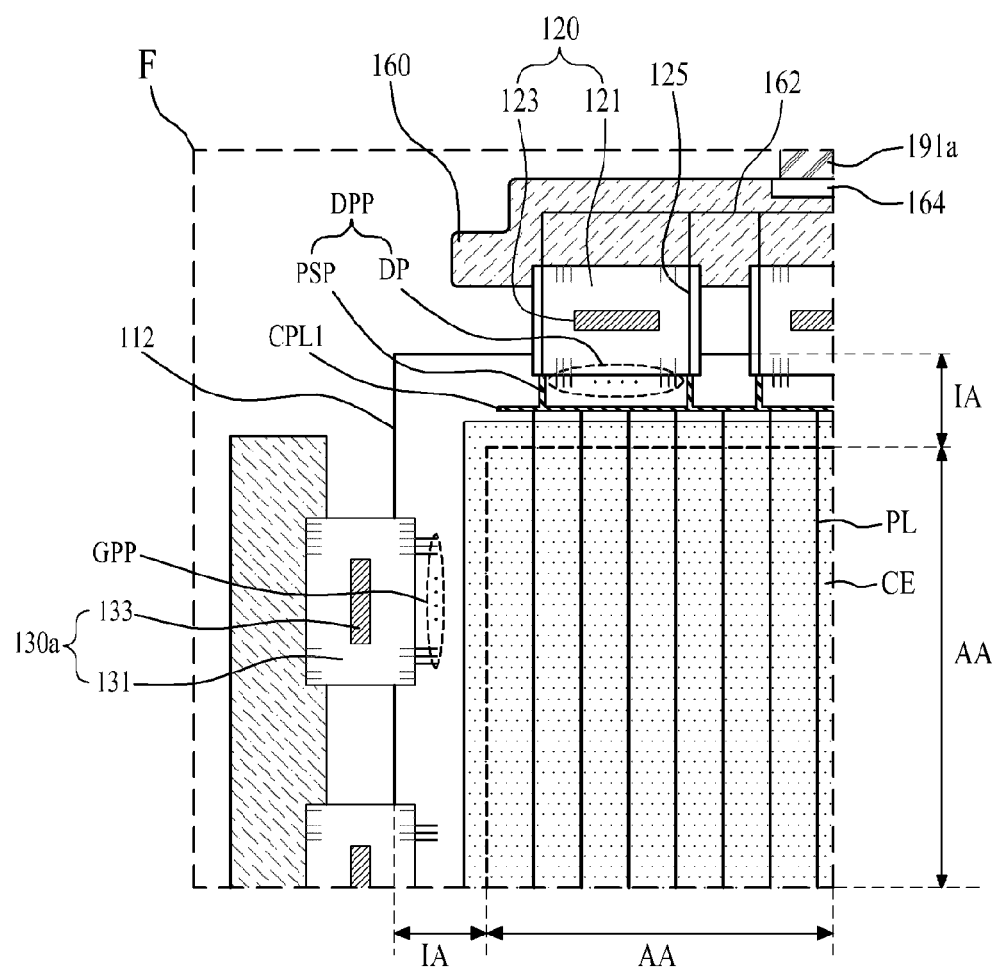
FIG. 16 is an enlarged view illustrating a portion F of FIG. 15.

FIG. 15 is a plan view for describing an organic light emitting display device according to a sixth embodiment of the present invention, and FIG. 16 is an enlarged view illustrating a portion F of FIG. 15.

Referring to FIGS. 15 and 16, the organic light emitting display device according to the sixth embodiment of the present invention includes a display panel 110, a plurality of data drivers 120, first and second gate drivers 130a and 130b, a plurality of lower driving power supply members 140b, a data PCB 160, first and second gate PCBs 170a and 170b, a driving power transfer board 180, and a control board 190.

Except that a plurality of upper driving power pad parts DSP1 provided in an upper inactive area of the first substrate 112 is included in each of the plurality of data pad parts DPP and thus a plurality of data pad parts DPP and a plurality of data drivers 120 are changed in structure, the display panel 110 is the same as the above-described display panel of FIG. 12. Therefore, only the plurality of data pad parts DPP and the plurality of data drivers 120 will be described below.

The plurality of data pad parts DPP are arranged at certain intervals in the upper inactive area IA of the first substrate 112. Each of the plurality of data pad parts DPP includes a plurality of data pads, connected to the plurality of data lines DL, and a plurality of upper driving power pads PSP.

Each of the plurality of data pads DP is connected to a corresponding data line DL through a data link line DLL.

A plurality of upper driving power pads PSP are provided at both sides of the data pad part DPP with the plurality of data pads DP therebetween to be connected to the first common driving power line CPL1. Therefore, the first common driving power line CPL1 is connected in common to the plurality of upper driving power pads PSP provided in the upper inactive area IA of the first substrate 112.

Each of the plurality of data drivers 120 includes a data flexible circuit film 121 adhered to the data pad part DPP and a data driving IC 123 mounted on the data flexible circuit film 121. Except that a plurality of driving power input lines 125 is added to the data flexible circuit film 121, the plurality of data drivers 120 are the same as the above-described data drivers of FIGS. 12 to 14.

Each of a plurality of driving power input lines formed at the data flexible circuit film 121 receives a driving voltage from the first driving power supply line 162 of the data PCB 160, and supplies the driving voltage to the upper driving power pad PSP of the data pad part DPP. Therefore, the driving voltage is supplied to an upper side of each of a plurality of driving power lines PL through the plurality of driving power input lines 125, the upper driving power pad PSP, and the first common driving power line CPL1.

The organic light emitting display device according to the sixth embodiment of the present invention supplies the driving voltage to the first and second common driving power lines CPL1 and CPL2 through the data flexible circuit film 121 of each of the plurality of data drivers 120, the driving power transfer board 180, and the lower driving power supply member 140b, thereby simultaneously supplying the driving voltage to the upper side and lower side of each of the plurality of driving power lines PL.

The organic light emitting display device according to the sixth embodiment of the present invention can provide the same effect as the first embodiment of the present invention, and since each of the plurality of data pad parts DPP includes the upper driving power pad, the upper driving power supply member 140a according to the fifth embodiment of the present invention can be removed. Therefore, when the display panel 110 has an ultra-high definition (UHD) of 3840×2160 or more, a space between the plurality of data pad parts DPP becomes narrower, and thus, it is difficult to adhere the plurality of upper driving power supply members 140a. However, the organic light emitting display device according to the sixth embodiment of the present invention does not use the plurality of upper driving power supply members 140a, and thus can stably supply the driving voltage to the display panel 100 having the UHD.

Figure 17:
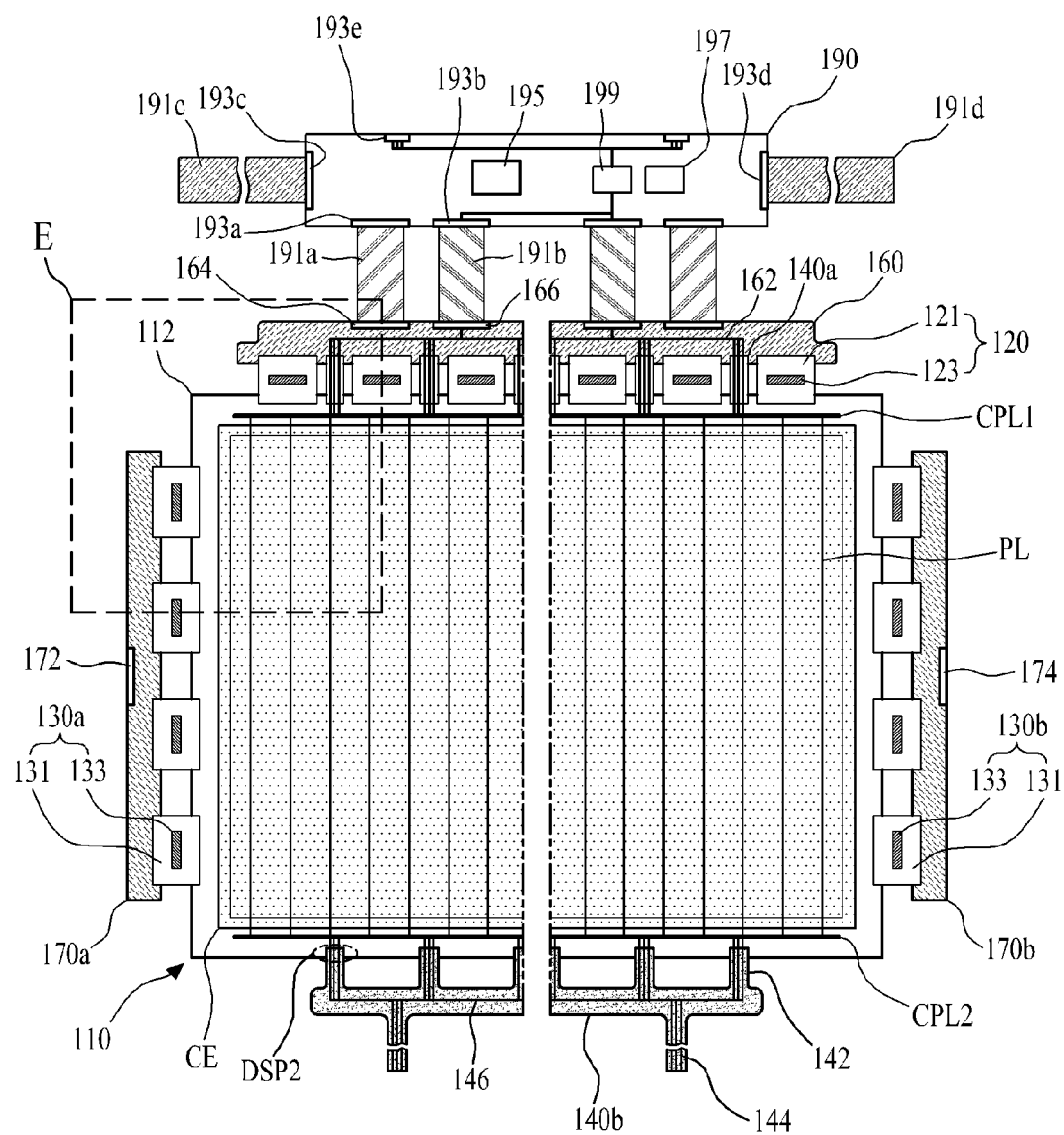
FIG. 17 is a plan view for describing an organic light emitting display device according to a seventh embodiment of the present invention.
Figure 18:
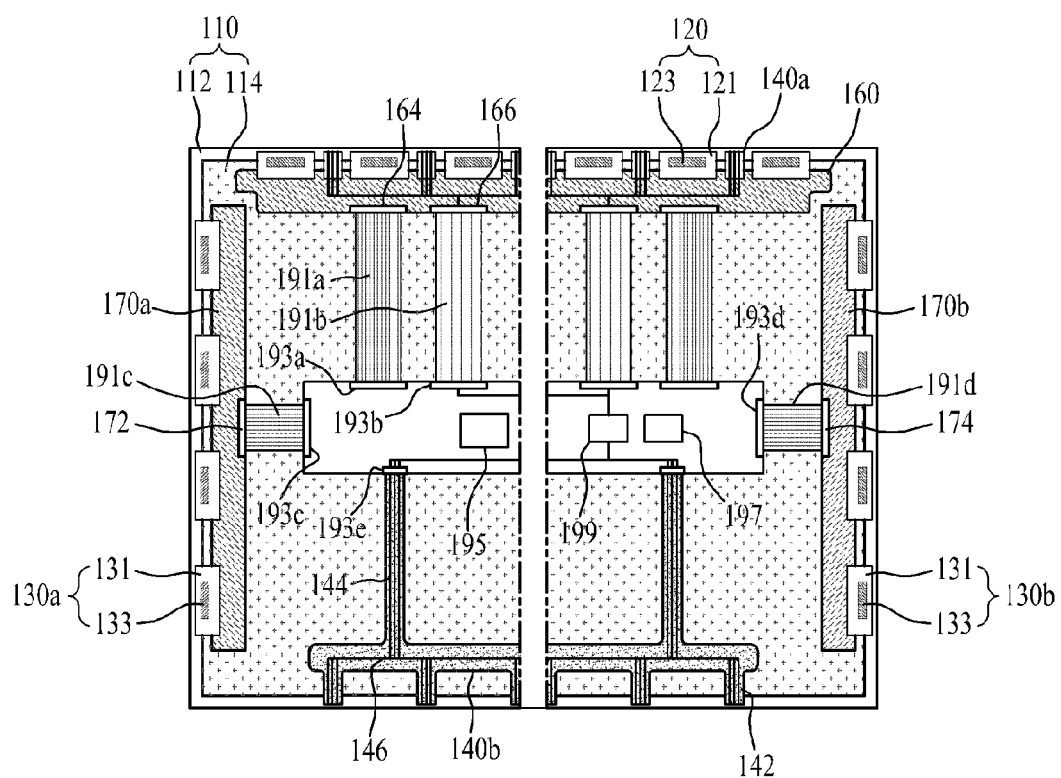
FIG. 18 is a rear view for describing an organic light emitting display device according to the seventh embodiment of the present invention.

FIG. 17 is a plan view for describing an organic light emitting display device according to a seventh embodiment of the present invention, and FIG. 18 is a rear view for describing an organic light emitting display device according to the seventh embodiment of the present invention.

Referring to FIGS. 17 and 18, the organic light emitting display device according to the seventh embodiment of the present invention includes a display panel 110, a plurality of data drivers 120, a plurality of first and second gate drivers 130a and 130b, a plurality of upper and lower driving power supply members 140a and 140b, a data PCB 160, first and second gate PCBs 170a and 170b, and a control board 190. Except that the driving power transfer board 180 is removed from the organic light emitting display device according to the fifth embodiment of the present invention illustrated in FIG. 12 and thus the lower driving power supply member 140b is changed in structure, the organic light emitting display device according to the seventh embodiment of the present invention is the same as the organic light emitting display device according to the fifth embodiment of the present invention. Therefore, only the lower driving power supply member 140b will be described below.

The lower driving power supply member 140b is a flexible circuit film that supplies a driving voltage, supplied from the control board 190, to the plurality of lower driving power pad parts DSP2 provided in a lower inactive area of the display panel 110, and includes a plurality of first and second connection protrusions 142 and 144 and the second driving power supply line 146.

The plurality of first connection protrusions 142 are adhered to the plurality of lower driving power pad parts DSP2, respectively.

The plurality of second connection protrusions 144 are connected to the fifth connector 193e mounted on the control board 190.

The lower driving power supply member 140b may be disposed at a rear surface of the second substrate 114 or a rear surface of the first substrate 112 depending on an emission type of the organic light emitting display device according to the present invention.

The second driving power supply line 146 allows a driving voltage, supplied from the plurality of second connection protrusions 144, to be supplied the plurality of lower driving power pad parts DSP2 through the respective first connection protrusions 142. Therefore, the driving voltage is supplied to a lower side of each of a plurality of driving power lines PL through the control board 190, the fifth connector 193e, the second connection protrusion 144, the second driving power supply line 146, the first connection protrusion 142, the lower driving power pad part DSP2, and the second common driving power line CPL2.

The organic light emitting display device according to the seventh embodiment of the present invention simultaneously supplies the driving voltage to an upper side and lower side of each of the plurality of driving power lines PL through the plurality of upper and lower driving power supply members 140a and 140b, and thus, the organic light emitting display device according to the seventh embodiment of the present invention provides the same effect as the organic light emitting display device according to the fifth embodiment of the present invention, and may not use the driving power transfer board 180 according to the fifth embodiment.

As an example, the upper driving power supply member 140a of the organic light emitting display device according to the seventh embodiment of the present invention may not be used as in the organic light emitting display device according to the sixth embodiment of the present invention.

As another example, the organic light emitting display devices according to the fifth to seventh embodiment of the present invention may further include the plurality of cathode connection parts CCP that are included in the organic light emitting display device according to the first or second embodiment of the present invention illustrated in FIGS. 2 to 6.

As another example, in the organic light emitting display devices according to the first to seventh embodiments of the present invention, each of the plurality of first and second gate drivers 130a and 130b has been described above as including the gate flexible circuit film 131 and the gate driving IC 133, but is not limited thereto. Each of the plurality of first and second gate drivers 130a and 130b may be configured with only the gate driving IC 133, and mounted on the first substrate 112 to be connected to the gate pad part PP2 in a chip-on glass (COG) structure. Alternatively, each of the plurality of first and second gate drivers 130a and 130b may be provided in the left and right inactive areas of the first substrate 112 to have a gate-in panel (GIP) through a process of manufacturing a TFT of each pixel. In this case, the first and second gate PCBs 170a and 170b may not be provided, and the gate control signal may be supplied to the gate driving IC 133 through the data flexible circuit film or a separate gate signal transfer film and a gate control signal transfer line formed at the first substrate 112.

As described above, the present invention simultaneously supplies the driving voltage to the upper side and lower side of the driving power line, and thus can solve a problem of an image quality caused by the length and line resistance deviation of the driving power line.

Moreover, the plurality of driving power lines are connected to the first and second common driving power lines in zigzags by the divided plurality of common division lines, and thus, a burning of the common driving power line can be prevented from being spread.

Moreover, by supplying the cathode voltage to the upper, lower, left, and right edges of the cathode electrode layer connected to each pixel, a voltage of the cathode electrode layer can be maintained at a constant level.

Moreover, the present invention simultaneously supplies the pixel driving voltage to the both sides of each of the plurality of driving power lines, and thus can solve a problem of an image quality caused by the length of the driving power line and the line resistance deviation.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. An organic light emitting display device comprising:
a first substrate configured to comprise an active area comprising a plurality of pixels and upper, lower, left, and right inactive areas defined near the active area;
a second substrate facing-coupled to the first substrate;
a first data printed circuit board provided in an upper perimeter area outside of the first substrate;
a second data printed circuit board provided in a lower perimeter area outside of the first substrate;
a plurality of first data drivers provided between, and connected to, both the first data printed circuit board and the upper inactive area of the first substrate; and a plurality of second data drivers provided between, and connected to, both the second data printed circuit board and the lower inactive area of the first substrate, wherein the first substrate comprises:
- a plurality of data lines and a plurality of gate lines formed in the active area to intersect each other, and configured to define a plurality of pixel areas in which the plurality of pixels are respectively formed;
- a plurality of driving power lines formed in the active area in parallel with the plurality of data lines, and configured to supply a driving voltage to the plurality of pixels;
- a cathode electrode layer connected to the plurality of pixels in common, and configured to supply a cathode voltage to the plurality of pixels;
- a plurality of driving power pads provided the upper inactive area, and a plurality of driving power pads provided in the lower inactive area;
- a first common driving power line formed in the upper inactive area, connected to an upper side of each of the plurality of driving power lines, and connected to the plurality of driving power pads provided in the upper inactive area;
- a second common driving power line formed in the lower inactive area, connected to a lower side of each of the plurality of driving power lines, and connected to the plurality of driving power pads provided in the lower inactive area; and
- a plurality of cathode connection parts provided in each of the left and right inactive areas to be connected to the cathode electrode layer, wherein the first data printed circuit board includes a first common driving power supply line connected to the plurality of first data drivers, and the second data printed circuit board includes a second common driving power supply line connected to the plurality of second data drivers, wherein each of the first data drivers is connected to two corresponding driving power pads of the plurality of driving power pads provided in the upper inactive area, each of the two corresponding driving power pads being disposed at opposite ends of a respective one of the first data drivers and each of the two corresponding driving power pads being connected to the first common driving power supply line, wherein each of the second data drivers is connected to two corresponding driving power pads of the plurality of driving power pads provided in the lower inactive area, each of the two corresponding driving power pads being disposed at opposite ends of a respective one of the second data drivers and each of the two corresponding driving power pads being connected to the second common driving power supply line, wherein the first common driving power line is connected to each of the plurality of first data drivers in the upper inactive area via the two corresponding driving power pads among the plurality of driving power pads provided in the upper inactive area, and wherein the second common driving power line is connected to each of the plurality of second data drivers in the lower inactive area via the two corresponding driving power pads among the plurality of driving power pads provided in the lower inactive area.

2. The organic light emitting display device of claim 1, wherein the first substrate further comprises a plurality of cathode power pads provided in each of the left and right inactive areas, and respectively connected to the plurality of cathode connection parts.

3. The organic light emitting display device of claim 2, wherein the first substrate further comprises:
- a plurality of first pad parts provided in each of the upper and lower inactive areas, and a plurality of data pads connected to an upper side and lower side of each of the plurality of data lines; and
- a plurality of second pad parts provided in each of the left and right inactive areas, and configured to comprise a plurality of gate pads connected to a left side and right side of each of the plurality of gate lines,
- wherein the plurality of driving power pads are comprised in each of the plurality of first pad parts, and the plurality of cathode power pads are comprised in each of the plurality of second pad parts.

4. The organic light emitting display device of claim 3, further comprising:
- a plurality of gate drivers configured to supply a gate pulse to each of the plurality of gate pads, and supply the cathode voltage to each of the plurality of cathode power pads.

5. The organic light emitting display device of claim 1, further comprising:
- a plurality of driving power input lines including two driving power input lines provided partially in the first data printed circuit board and, respectively, in each of the first data drivers; and
- a plurality of driving power input lines including two driving power input lines provided. partially in the second data printed circuit board and respectively, in each of the second data drivers,
- wherein the two driving power input lines provided, respectively, in each of the first data drivers are connected to both the first common driving power supply line and the two corresponding driving power pads provided in the upper inactive area and the two driving power input lines provided, respectively, in each of the second data drivers are connected to both the second common driving power supply line and the two corresponding driving power pads provided in the lower inactive area.

6. The organic light emitting display device of claim 5, wherein the first and second common driving power supply lines are directly connected to the plurality of driving power input lines but not to the plurality of data lines, and
wherein the first and second data drivers are connected to the data lines formed in the active area via a plurality of data pads provided in the upper and lower inactive areas, respectively.

* * * * *